US011145525B2

(12) United States Patent
Ikeda et al.

(10) Patent No.: US 11,145,525 B2
(45) Date of Patent: Oct. 12, 2021

(54) COMPONENT MOUNTING LINE

(71) Applicant: Panasonic Intellectual Property Management Co., Ltd., Osaka (JP)

(72) Inventors: Masanori Ikeda, Tokyo (JP); Katsusuke Fukasawa, Tokyo (JP); Kazuhiko Itose, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 203 days.

(21) Appl. No.: 16/388,005

(22) Filed: Apr. 18, 2019

(65) Prior Publication Data
US 2019/0333792 A1  Oct. 31, 2019

(30) Foreign Application Priority Data

Apr. 25, 2018  (JP) .............................. JP2018-084340

(51) Int. Cl.
*H01L 21/67* (2006.01)
*H05K 3/34* (2006.01)
*H05K 13/04* (2006.01)

(52) U.S. Cl.
CPC ......... *H01L 21/67144* (2013.01); *H05K 3/34* (2013.01); *H05K 13/04* (2013.01)

(58) Field of Classification Search
CPC ..... H05K 3/34; H05K 13/04; H01L 21/67144
See application file for complete search history.

(56) References Cited

U.S. PATENT DOCUMENTS

| 4,809,308 A * | 2/1989 | Adams ................ G01N 23/083 |
| | | 378/98.2 |
| 4,926,452 A * | 5/1990 | Baker ................. G01R 31/302 |
| | | 378/22 |
| 10,338,269 B2 * | 7/2019 | Dreiseitel ............. G01V 5/005 |
| 2011/0081070 A1 * | 4/2011 | Yamamoto ............... G06T 5/50 |
| | | 382/145 |

FOREIGN PATENT DOCUMENTS

| JP | 2001012932 A  * | 1/2001 |
| JP | 2005-142586 A  * | 6/2005 |
| JP | 3773521 B2 | 5/2006 |
| JP | 2011-018696 A  * | 1/2011 |

* cited by examiner

*Primary Examiner* — Carl J Arbes
(74) *Attorney, Agent, or Firm* — Pearne & Gordon LLP

(57) ABSTRACT

A component mounting line includes a plurality of component mounting apparatuses, each of which mounts solder and a component other than the solder on a substrate. The component mounting line includes: a time limit management unit configured to manage an elapsed time period of a member; and a usability determiner that determines whether the member is usable based on the elapsed time period of the member. The elapsed time period is a time period that has elapsed after the member is exposed to the air, and the member comprises at least one of a substrate, solder, and a component other than the solder.

11 Claims, 11 Drawing Sheets

COMPONENT MOUNTING LINE

CROSS REFERENCE TO RELATED APPLICATION

This application claims the benefit of priority of Japanese Patent Application Number 2018-084340 filed on Apr. 25, 2018, the entire content of which is hereby incorporated by reference.

BACKGROUND

1. Technical Field

The present disclosure relates to a component mounting line, a component mounting method, and a quality control system.

2. Description of the Related Art

Conventionally, a component mounting apparatus that mounts components on a substrate on which solder has been printed is known. Apparatuses for component mounting disclosed in Japanese Unexamined Patent Application Publication No. 2011-18696 (Patent Literature (PTL) 1), for example, include an inspection apparatus that inspects a state in which a component is soldered onto a substrate, and a quality control system in which values set for an apparatus that prints solder on a substrate are changed when an abnormality is detected in a result of the inspection.

SUMMARY

According to PTL 1, however, the inspection apparatus inspects the soldered state of a component on a substrate and detects a failure in a solder joint between the substrate and the component, but it is difficult to detect in advance the occurrence of a defective product.

In view of this, the present disclosure has an object to provide a component mounting line, a component mounting method, and a quality control system, with which it is possible to inhibit the manufacture of a defective product by predicting a failure in a solder joint between a substrate and a component.

In order to achieve the above-described object, a component mounting line according to one aspect of the present disclosure is a component mounting line that includes a plurality of component mounting apparatuses, each of which mounts solder and a component other than the solder on a substrate. The component mounting line includes: a time limit management unit configured to manage an elapsed time period of a member, the elapsed time period being a time period that has elapsed after the member is exposed to air, the member comprising at least one of the substrate, the solder, and the component; and a usability determiner that determines whether the member is usable based on the elapsed time period of the member.

Note that these comprehensive or concrete embodiments may be realized by a system, a method, an integrated circuit, a computer program, or a computer-readable recording medium such as a CD-ROM, or by any combination thereof.

With the component mounting line, component mounting method, and quality control system according to the present disclosure, it is possible to inhibit the manufacture of a defective product by predicting a timing at which a solder joint between a substrate and a component fails.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
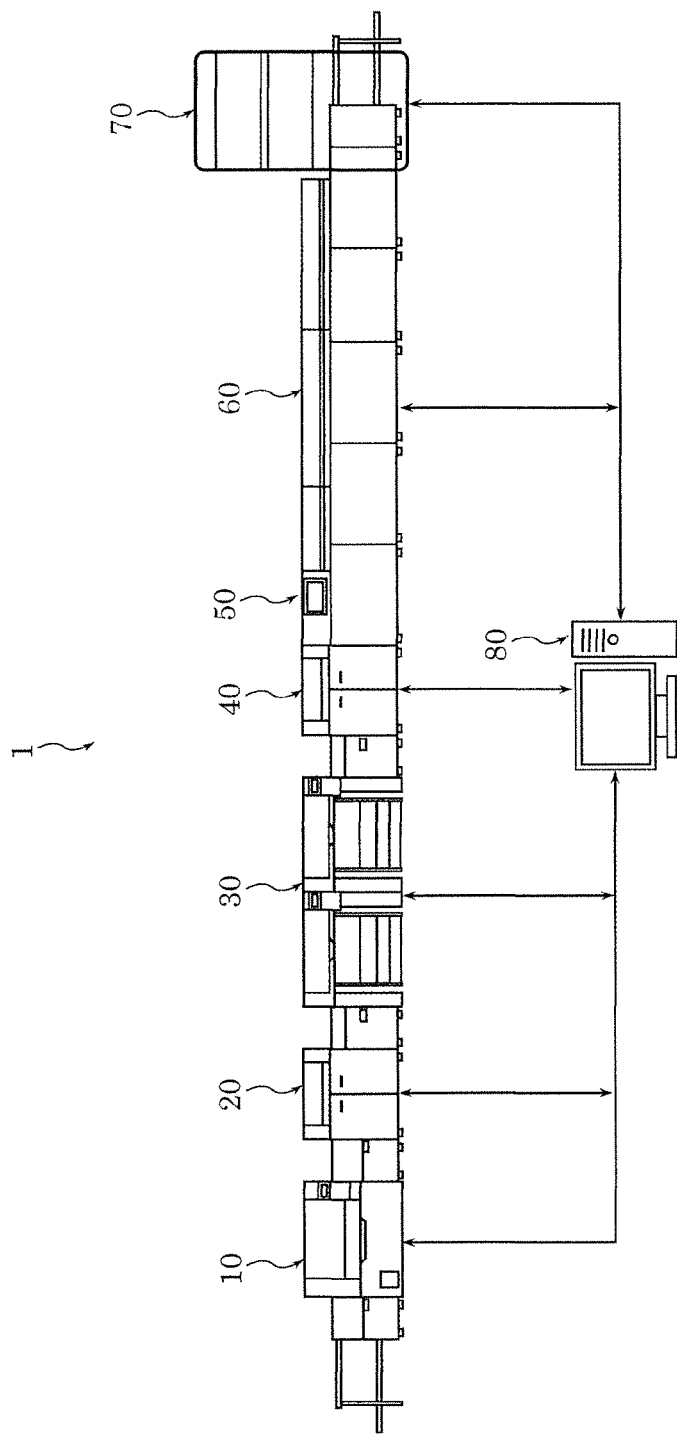
FIG. 1 is an external view illustrating a component mounting line according to Embodiment 1.

In order to achieve the above-described object, a component mounting line according to one aspect of the present disclosure is a component mounting line that includes a plurality of component mounting apparatuses, each of which mounts solder and a component other than the solder on a substrate. The component mounting line includes: a time limit management unit configured to manage an elapsed time period of a member, the elapsed time period being a time period that has elapsed after the member is exposed to air, the member comprising at least one of the substrate, the solder, and the component; and a usability determiner that determines whether the member is usable based on the elapsed time period of the member.

In general, a substrate, solder, and a component other than the solder each have an expiration date by which it is recommended to join the substrate to the component by the solder after exposure to the air, and if any one of expiration dates has expired, a failure occurs in joining the substrate and the component by the solder, in some cases. Such a solder joint failure includes not only a state in which a substrate and a component are not joined by solder, but also a state in which a desired joint strength is not achieved even though a substrate is actually joined to a component by solder. A defective product having such a failed solder joint is detected in an inspection, but there has been a demand for detecting in advance the occurrence of a defective product to inhibit the manufacture of a defective product.

In view of this, in the aforementioned component mounting line, the usability determiner determines whether a member is usable based on an elapsed time period of the member. The elapsed time period is a time period that has elapsed after the member is exposed to the air. The member comprises at least one of a substrate, solder, and a component other than the solder. With such a component mounting line, if each member is usable, for example, it is possible to obtain a good product resulting from a substrate and a component that are joined by solder with a desired strength. In addition, with just one member determined to be unusable, it is possible to detect a sign predicting that a defective product is obtained.

Accordingly, the detection of a sign predicting a failure in a solder joint between a substrate and a component can inhibit the manufacture of a defective product. Thus, with the aforementioned component mounting line, it is easy to manufacture good products.

It should be particularly noted that with this component mounting line, it is possible to find out the expiration dates of members based on the elapsed time periods of the members, before manufacturing a product, and thereby determine, at a time point when a component is joined to a substrate by solder, whether a good product or a defective product is to be manufactured. Thus, it is possible to detect a sign predicting the start of the manufacture of a defective product having a failed solder joint, when a substrate and a component are joined together by solder. As a result, the component mounting line inhibits the manufacture of defective products, and this enables the manufacture of good products. It is therefore possible to inhibit the reduction of yields in manufacturing products.

A component mounting method according to one aspect of the present disclosure includes: managing an elapsed time period of a member, the elapsed time period being a time period that has elapsed after the member is exposed to air, the member comprising at least one of a substrate, solder, and a component other than the solder; and determining whether the member is usable based on the elapsed time period which is a time period that has elapsed until the solder and the component are mounted on the substrate.

A quality control system according to one aspect of the present disclosure includes: a time limit management unit configured to manage an elapsed time period and an expiration date of a member, the elapsed time period being a time period that has elapsed after the member is exposed to air, the member comprising at least one of a substrate, solder, and a component other than the solder; an inspection result obtainer that obtains an inspection result which is a result of a radiographic inspection conducted to examine a state of the substrate on which the solder and the component are mounted; and a usability determiner that determines whether the member is usable based on the inspection result, and the elapsed time period and the expiration date of the member subjected to the radiographic inspection.

Even with the above-described component mounting method and quality control system, the same advantageous effects as those described above can be achieved.

The component mounting line according to one aspect of the present disclosure further includes an inspection result obtainer that obtains an inspection result which is a result of a radiographic inspection conducted to examine a state of the substrate on which the solder and the component are mounted. The usability determiner determines whether the member is usable based on a correlation chart indicating a relationship between the elapsed time period and a probability of void formation in the solder mounted on the substrate, the elapsed time period being a time period that has elapsed until the solder and the component are mounted on the substrate, the probability of void formation being calculated based on the inspection result.

According to this feature, if an elapsed time period until solder and a component other than the solder are mounted on a substrate gets longer, for example, an expiration date of each member becomes shorter and the probability of void formation rises. Therefore, by using a correlation chart, the usability determiner is capable of detecting a sign predicting the start of the manufacture of a defective product.

In the component mounting line according to one aspect of the present disclosure, the usability determiner obtains, based on the correlation chart, a first threshold value for the elapsed time period, below which the probability of void formation is less than or equal to a predetermined value, and determines that the member is usable when the elapsed time period managed by the time limit management unit is less than the first threshold value.

Since the usability determiner thus obtains, based on a correlation chart, the first threshold value for an elapsed time period, below which the probability of void formation in solder is less than or equal to a predetermined value, it is possible for the usability determiner to more accurately determine that a member is usable.

The component mounting line according to one aspect of the present disclosure further includes an inspection result obtainer that obtains an inspection result which is a result of a radiographic inspection conducted to examine a state of the substrate on which the solder and the component are mounted. The usability determiner determines whether the member is usable based on a correlation chart indicating a relationship between the elapsed time period and a degree of dewetting of the member, the elapsed time period being a time period that has elapsed until the solder and the component are mounted on the substrate, the degree of dewetting being calculated based on the inspection result.

According to this feature, if the elapsed time period of a member gets longer, the expiration date of the member becomes shorter because the member absorbs moisture in the air, and the degree of dewetting gets higher. Thus, by using a correlation chart, the usability determiner is capable of detecting a sign predicting the start of the manufacture of a defective product.

In the component mounting line according to one aspect of the present disclosure, the usability determiner obtains, based on the correlation chart, a second threshold value for the elapsed time period, below which the degree of dewetting is less than or equal to a predetermined value, and determines that the member is usable when the elapsed time period managed by the time limit management unit is less than the second threshold value.

Since the usability determiner thus obtains, based on a correlation chart, the second threshold value for an elapsed time period, below which the degree of dewetting of a member is less than or equal to a predetermined value, it is possible for the usability determiner to more accurately determine that the member is usable.

The component mounting line according to one aspect of the present disclosure further includes a prohibition time estimator that estimates, based on the correlation chart, a use prohibition time which is a time from which a use of the member is prohibited, and outputs, to the usability determiner, information indicating the use prohibition time. The usability determiner further determines whether the member is usable based on the information indicating the use prohibition time.

Thus, the estimation of the use prohibition time based on a correlation chart, which is carried out by the prohibition time estimator, enables the usability determiner to more accurately detect a sign predicting the start of the manufacture of a defective product. It is therefore possible to inhibit the manufacture of a defective product.

The component mounting line according to one aspect of the present disclosure further includes a storage that stores a plurality of correlation charts each being associated with a type of the member, the plurality of correlation charts each being the correlation chart.

With this feature, by using correlation charts each being associated with the type of members, it is possible to detect a sign predicting the manufacture of a defective product that varies depending on a combination of the members. Thus, with the component mounting line as described above, it is easier to manufacture good products.

The component mounting line according to one aspect of the present further includes: an inspection result obtainer that obtains an inspection result which is a result of a radiographic inspection conducted to examine a state of the substrate on which the solder and the component are mounted; a trainer that generates feature information based on the elapsed time period and a probability of void formation in the solder mounted on the substrate, the feature information indicating a tendency of the probability of void formation that varies each time the solder is mounted on the substrate, the elapsed time period being a time period that has elapsed until the solder and the component are mounted on the substrate, the probability of void formation being calculated based on the inspection result; and a prohibition time estimator that estimates, based on the feature information, a time from which a use of the member is prohibited.

The trainer is thus capable of teaching, through machine learning, a tendency of the probability of void formation that varies according to the elapsed time period of a member, and generating feature information indicating a result of the machine learning. Thus, the prohibition time estimator is capable of more precisely estimating a time point from which the use of a member is prohibited, based on feature information indicating the tendency of the probability of void formation. As a result, with the component mounting line as described above, it is easier to manufacture good products.

The component mounting line according to one aspect of the present disclosure further includes: an inspection result obtainer that obtains an inspection result which is a result of a radiographic inspection conducted to examine a state of the substrate on which the solder and the component are mounted; a trainer that generates feature information based on the elapsed time period and a degree of dewetting of the member, the feature information indicating a tendency of the degree of dewetting that varies each time the solder is mounted on the substrate, the degree of dewetting being calculated based on the inspection result; and a prohibition time estimator that estimates, based on the feature information, a time from which a use of the member is prohibited.

The trainer is thus capable of teaching, through machine learning, a tendency of the degree of dewetting that varies according to the elapsed time period of a member, and generating feature information indicating a result of the machine learning. Thus, the prohibition time estimator is capable of more precisely estimating a time point from which the use of a member is prohibited, based on feature information indicating the tendency of the degree of dewetting. As a result, with the component mounting line as described above, it is easier to manufacture good products.

The component mounting line according to one aspect of the present disclosure further includes: a solder printing apparatus that prints solder on the substrate; and an inspection apparatus that conducts a radiographic inspection to examine a state of the member mounted.

With such a component mounting line, it is possible to print solder on a substrate by the printing apparatus, and conduct a radiographic inspection by the inspection apparatus in order to examine the state of a member mounted.

The component mounting line according to one aspect of the present disclosure further includes a notifier that notifies that, when a sign predicting that the member becomes unusable is detected in the inspection result, the sign has been detected.

With this feature, when a sign predicting that a member becomes unusable is detected in the result of a determination on whether the member is usable, the notifier notifies that the sign has been detected. Thus, it is possible, for example, to stop the printing apparatus from printing solder on a substrate, to stop the component mounting apparatus from mounting a component on solder printed on a substrate, or to stop the inspection apparatus from examining the state of a member.

Note that these comprehensive or concrete embodiments may be realized by a system, a method, an integrated circuit, a computer program, or a computer-readable recording medium such as a CD-ROM, or by any combination thereof.

The following describes in detail the embodiment for implementing the present invention with reference to the drawings. Note that the embodiments described below each show an illustrative embodiment of the present disclosure. The numerical values, shapes, materials, elements, the arrangement and connection of the elements, steps, order of the steps, etc. indicated in the following embodiments are mere examples, and therefore are not intended to limit the scope of the present disclosure. Among elements in the following embodiments, those not recited in any one of the broadest, independent claims are described as optional elements.

Note that the drawings are presented schematically and are not necessarily precise illustrations. In addition, like reference signs are assigned to substantially identical elements in the drawings, and overlapping descriptions thereof are omitted or simplified.

The following describes a component mounting line, a component mounting method, and a quality control system according to the embodiments of the present disclosure.

Embodiment 1

[Configuration]

First, a configuration of component mounting line 1 according to this embodiment will be described.

FIG. 1 is an external view illustrating component mounting line 1 according to Embodiment 1.

As illustrated in FIG. 1, component mounting line 1 is a manufacturing line for manufacturing a product by mounting components on a substrate on which solder is printed, and also for inspecting quality control on whether a substrate and a component are appropriately joined by solder in a manufactured product.

The mounting of components on a substrate here means that solder printed on the substrate is joined to a component deposited on the solder through a reflow process. A substrate here is a circuit board on which an electronic circuit is formed. Moreover, a member needs to comprise at least one of a substrate, solder, and a component other than the solder, but a member according to this embodiment is a general term including all of a substrate, solder, and a component other than the solder. Electronic components other than solder are collectively referred to as components, and in this embodiment, a component is referred to as an electronic component.

Figure 2:
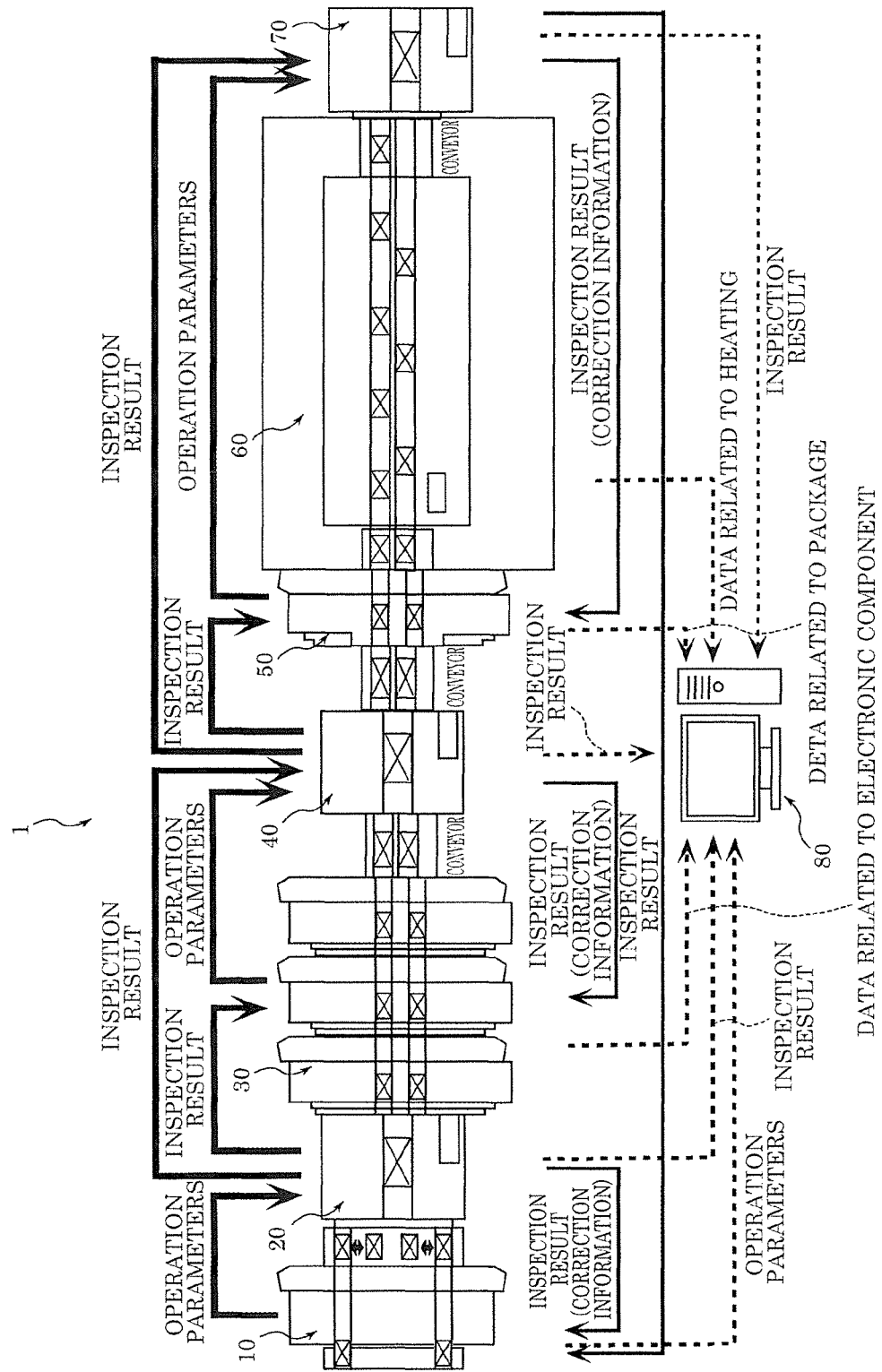
FIG. 2 is a pattern diagram schematically illustrating the component mounting line according to Embodiment 1.
Figure 3:
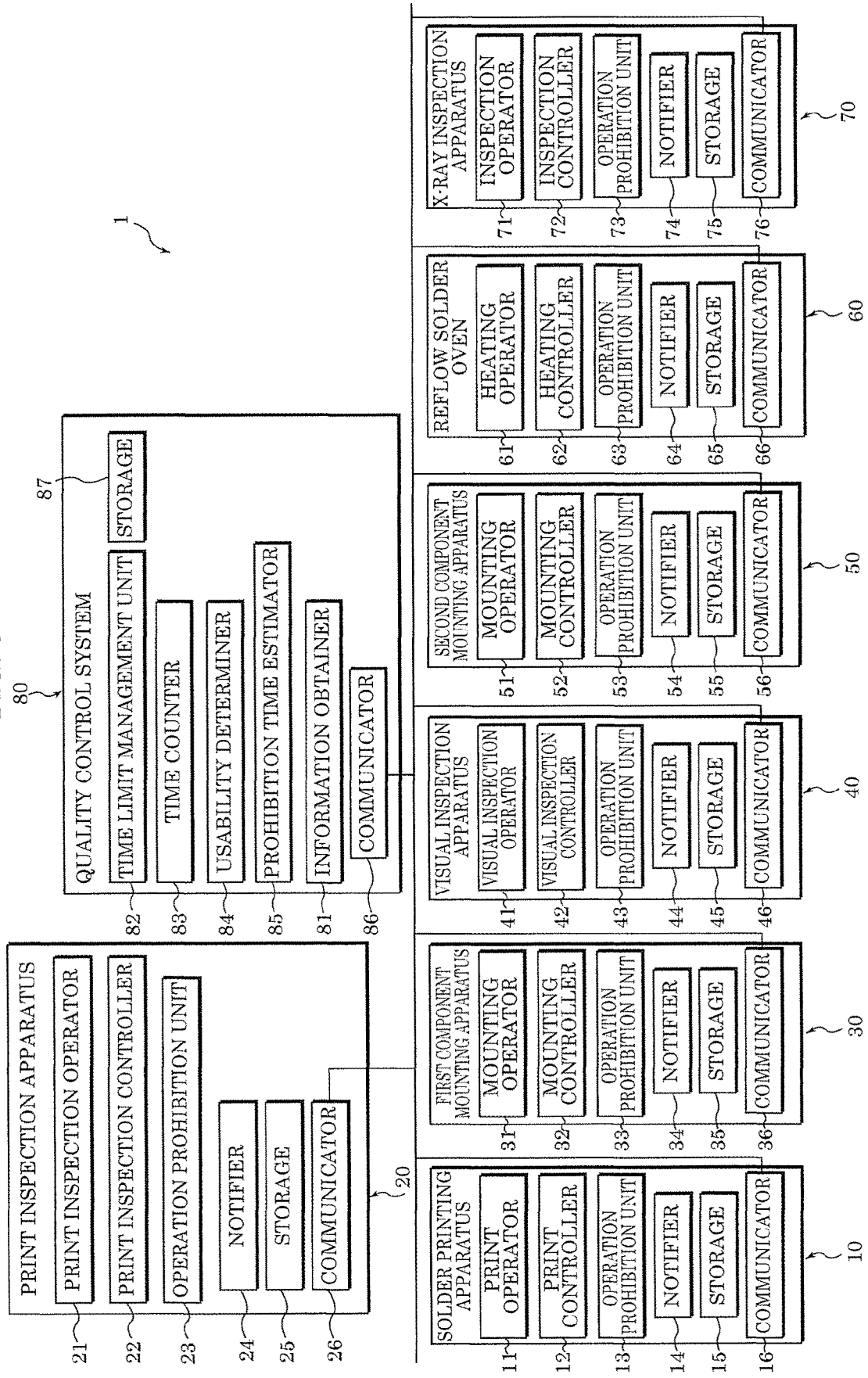
FIG. 3 is a block diagram illustrating the component mounting line according to Embodiment 1.

FIG. 2 is a pattern diagram schematically illustrating component mounting line 1 according to Embodiment 1. FIG. 3 is a block diagram illustrating component mounting line 1 according to Embodiment 1. As illustrated in FIG. 2 and FIG. 3, component mounting line 1 includes solder printing apparatus 10, print inspection apparatus 20, first component mounting apparatus 30, visual inspection apparatus 40, second component mounting apparatus 50, reflow solder oven 60, and X-ray inspection apparatus 70 in line in the stated order.

[Solder Printing Apparatus]

Solder printing apparatus 10 is an apparatus that prints, via a mask, cream solder on an electrode formed on a substrate. It should be noted that solder printing apparatus 10 prints cream solder on a substrate, but a solder printing method should not be limited to such, and solder printing apparatus 10 may print solder on a substrate using a different method that is publicly known. Solder printing apparatus 10 is an example of one configuration included in apparatuses for component mounting.

Solder printing apparatus 10 includes print operator 11, print controller 12, operation prohibition unit 13, notifier 14, storage 15, and communicator 16.

Print operator 11 is a device that causes a mask, which has openings corresponding to a cream solder pattern, to contact a substrate, and transfers the cream solder pattern on the substrate by wiping a squeegee on the mask after having placed cream solder on the mask, as it is called, screen printing.

Print controller 12 controls print operator 11 that holds a substrate and a mask, and causes a squeegee to wipe, based on operation parameters for printing cream solder. Print controller 12 is also capable of controlling the speed of printing cream solder on a substrate. Print controller 12 transmits, to quality control system 80 via communicator 16, the operation parameters for printing cream solder. In addition, print controller 12 feeds forward, to print inspection apparatus 20 via communicator 16, the operation parameters for printing cream solder.

Upon obtaining an operation prohibition command, operation prohibition unit 13 prohibits the operation of solder printing apparatus 10. Specifically, operation prohibition unit 13 outputs an operation prohibition command to print controller 12, and print controller 12 having received the command stops the drive of print operator 11. For example, when it is determined that the expiration date of a member expires, operation prohibition unit 13 prohibits, via print controller 12, the operation of print operator 11 that prints cream solder on a substrate. Similarly, when an operation prohibition command is obtained from other apparatus, operation prohibition unit 13 stops the drive of print operator 11.

An expiration date of a member is a time limit until when a member expected to manufacture a desired product is usable. In the case where a member whose expiration date has expired is used for the manufacture of a product, it is difficult to obtain a desired product.

Notifier 14 notifies of information indicating that the expiration date of a member has expired or notifies that the expiration date of solder is approaching, based on the expiration date of solder, etc. Based on the results of inspections each being performed by print inspection apparatus 20, visual inspection apparatus 40, or X-ray inspection apparatus 70, notifier 14 also notifies of information related to abnormality when an abnormality is detected in any of the inspection results or notifies of a sign predicting that a member becomes unusable when a sign of abnormality is detected in any of the inspection results. The notification here means a notification of such information not exclusively to neighbor apparatuses, but also to other apparatuses via sound, light, image, etc.

It should be noted that notifier 14 may output information indicating such a notification to print inspection apparatus 20, first component mounting apparatus 30, visual inspection apparatus 40, second component mounting apparatus 50, reflow solder oven 60, X-ray inspection apparatus 70, quality control system 80, etc. With this, component mounting line 1 stops its operation.

Storage 15 stores solder information to be mentioned later, operation parameters for printing cream solder, etc. The operation parameters are newly updated by feedback from print inspection apparatus 20, etc.

Communicator 16 is a communication module that transmits, to quality control system 80, operation parameters for printing cream solder, and receives an operation prohibition command, etc. from quality control system 80, etc.

[Print Inspection Apparatus]

Print inspection apparatus 20 is an apparatus that inspects the visual state of solder printed on a substrate. Print inspection apparatus 20 includes print inspection operator 21, print inspection controller 22, operation prohibition unit 23, notifier 24, storage 25, and communicator 26.

Print inspection operator 21 recognizes solder printed on a substrate by processing at least either two-dimensional images or three-dimensional images obtained through image capturing by a camera intended for inspection.

Print inspection controller 22 causes print inspection operator 21 to inspect the visual state of solder printed on a substrate based on operation parameters, and thus analyzes the visual state of the solder. Specifically, print inspection controller 22 analyzes solder printed on a substrate, to observe an amount of displacement from the position at which the solder is supposed to be printed as well as the dimensions of the solder when the substrate is viewed from above, and the volume, height, and form of the solder, and also analyzes the presence/absence of defects such as a bridge failure resulting in a connection between two electrodes, a filling failure, an insufficient amount of solder, a dent in a solder, bleeding of solder, any foreign substance attached, etc.

Print inspection controller 22 feeds back, to solder printing apparatus 10, data indicating a result of the inspection in which the solder printed on the substrate is analyzed, feeds forward the data to first component mounting apparatus 30, and also transmits the data to quality control system 80.

When an abnormality is detected in the result of a solder inspection, print inspection controller 22 creates correction information based on the detected abnormality and feeds the correction information back to solder printing apparatus 10, in order to overcome the problem caused by operation parameters for solder printing apparatus 10. For example, when variation in solder printing is within a predetermined range based on the operation parameters for solder printing apparatus 10, print inspection controller 22 creates correction information based on the variation in solder printing, and feeds the correction information back to solder printing apparatus 10. With this, solder printing apparatus 10 rewrites the operation parameters based on the correction information. Solder printing apparatus 10 is capable of identifying a part where a problem has occurred, before reaching the stage of manufacturing a defective substrate, and appropriately performing feedback control. Solder printing apparatus 10 thus enhances the yields of a component mounting system.

It should be noted that when solder is visually defective, print inspection controller 22 may transmit an operation prohibition command, via communicator 26, to solder printing apparatus 10, print inspection apparatus 20, first component mounting apparatus 30, visual inspection apparatus 40, second component mounting apparatus 50, reflow solder oven 60, and X-ray inspection apparatus 70. With this, component mounting line 1 stops its operation.

When it is determined that an elapsed time of a substrate on which solder is printed exceeds the expiration date of the substrate before a component is mounted, operation prohibition unit 23 prohibits the operation of print inspection apparatus 20. Specifically, operation prohibition unit 23 outputs an operation prohibition command to print inspection controller 22, and print inspection controller 22 having received the command stops the drive of print inspection operator 21. When it is determined that the expiration date of a member has expired, operation prohibition unit 23 prohibits, via print inspection controller 22, the operation of print inspection operator 21 that inspects solder printed on a substrate. Similarly, when an operation prohibition command is obtained from other apparatus, operation prohibition unit 23 stops the drive of print inspection operator 21.

Notifier 24 notifies of information indicating a problem such that the expiration date of a member has expired or notifies that the expiration date of solder is approaching, based on the result of a solder inspection and the expiration date of the member. Based on the results of inspections each being performed by print inspection apparatus 20, visual inspection apparatus 40, or X-ray inspection apparatus 70, notifier 24 also notifies of information related to abnormality when an abnormality is detected in any of the inspection results or notifies of a sign predicting that a member becomes unusable when a sign of abnormality is detected in any of the inspection results. It should be noted that the configuration of notifier 24 is the same as that of notifier 14 in solder printing apparatus 10, therefore, the description of the same configuration is omitted.

Storage 25 stores operation parameters for inspecting solder printed on a substrate. Storage 25 also stores data indicating the result of an inspection on solder printed on a substrate, correction information created based on this data, etc.

Communicator 26 is a communication module that transmits, to quality control system 80, operation parameters for inspecting solder printed on a substrate, data indicating the result of an inspection on solder printed on a substrate, etc., and receives an operation prohibition command, etc. from quality control system 80, etc.

[First Component Mounting Apparatus]

First component mounting apparatus 30 is an apparatus that deposits, on solder printed on a substrate, an electronic component sucked by a nozzle head. First component mounting apparatus 30 is an example of one configuration included in apparatuses for component mounting.

First component mounting apparatus 30 includes mounting operator 31, mounting controller 32, operation prohibition unit 33, notifier 34, storage 35, and communicator 36.

Mounting operator 31 repeats a process of: sucking and holding, by a nozzle head, an electronic component in a component provider; transporting, by the nozzle head, the electronic component to a position, on the substrate, at which the electronic component is to be deposited; and depositing the electronic component on the substrate for the times as many as the number of electronic components to be mounted.

Mounting controller 32 controls the transportation of a nozzle based on operation parameters for mounting electronic components. Specifically, mounting controller 32 causes a nozzle head to be transported to a component feeder which feeds each of the electronic components, and then to be transported, while the electronic component is sucked by the nozzle head, to a position, on the substrate, at which an electronic component is to be deposited. Mounting controller 32 is also capable of controlling the speed of depositing an electronic component on a substrate.

The component feeder here includes, for example, a plurality of tape feeders, etc. that are detachably provided, and various types of electronic components are fed by the tape feeders, etc. A tape feeder is a device for sequentially feeding, to a component feeder, electronic components that are aligned in the form of a tape and thus held.

Mounting controller 32 transmits, to quality control system 80 via communicator 36, operation parameters for mounting electronic components on a substrate. Mounting controller 32 also feeds forward, to visual inspection apparatus 40 via communicator 36, the operation parameters for mounting electronic components on a substrate.

Upon obtaining an operation prohibition command, operation prohibition unit 33 prohibits the operation of first component mounting apparatus 30. Specifically, operation prohibition unit 33 outputs an operation prohibition command to mounting controller 32, and mounting controller 32 having received the command stops the drive of mounting operator 31. For example, when it is determined that the expiration date of a member expires, operation prohibition unit 33 prohibits, via mounting controller 32, the operation of mounting operator 31 that deposits an electronic component on a substrate, for example. Similarly, when an operation prohibition command is obtained from other apparatus, operation prohibition unit 33 stops the drive of mounting operator 31.

Notifier 34 notifies of information indicating a problem such that the expiration date of a member has expired or notifies that the expiration date of solder is approaching, based on the result of an electronic component inspection and the expiration date of the member. Based on the results of inspections each being performed by print inspection apparatus 20, visual inspection apparatus 40, or X-ray inspection apparatus 70, notifier 34 also notifies of information related to abnormality when an abnormality is detected in any of the inspection results or notifies of a sign predicting that a member becomes unusable when a sign of abnormality is detected in any of the inspection results. It should be noted that the configuration of notifier 34 is the same as that of notifier 14 in solder printing apparatus 10, therefore, the description of the same configuration is omitted.

Storage 35 stores component information to be mentioned later, operation parameters for depositing electronic components on a substrate, etc.

Communicator 36 is a communication module that transmits, to quality control system 80, operation parameters for depositing electronic components on a substrate, and receives an operation prohibition command, etc. from quality control system 80, etc.

[Visual Inspection Apparatus]

Visual inspection apparatus 40 is an apparatus that inspects the visual state of an electronic component deposited on a substrate. Visual inspection apparatus 40 is also referred to as "automated optical inspection (AOI)". Visual inspection apparatus 40 includes visual inspection operator 41, visual inspection controller 42, operation prohibition unit 43, notifier 44, storage 45, and communicator 46.

Visual inspection operator 41 recognizes an electronic component deposited on a substrate by processing at least either two-dimensional images or three-dimensional images obtained through image capturing by a camera intended for inspection.

Visual inspection controller 42 causes visual inspection operator 41 to inspect the visual state of an electronic component deposited on a substrate based on operation parameters, and thus analyzes the visual state of the electronic component. Specifically, visual inspection controller 42 analyzes an electronic component deposited on a substrate, to observe an amount of displacement from a position at which the electronic component is supposed to be deposited, when the substrate is viewed from above, as well as an amount of rising, and also analyzes the presence/absence of defects such as an electronic component being mounted upside down, a missing electronic component, a bridge failure resulting in a connection between two electrodes, any foreign substances attached, mounting a wrong electronic component, mounting an electronic component over time, lead deformation in an electronic component, etc.

Visual inspection apparatus 40 feeds back data indicating a result of the inspection in which the electronic component deposited on the substrate is analyzed and feeds forward the data to second component mounting apparatus 50. Visual inspection apparatus 40 also transmits the data indicating the inspection result of the electronic component to quality control system 80 and X-ray inspection apparatus 70.

When an abnormality is detected in the result of a visual inspection, visual inspection controller 42 creates correction information based on the detected abnormality and feeds the correction information back to first component mounting apparatus 30, in order to overcome the problem caused by operation parameters for first component mounting apparatus 30. For example, when variation in the placement of electronic components is within a predetermined range based on the operation parameters for first component mounting apparatus 30, visual inspection controller 42 creates correction information based on the variation in the placement of electronic components, and feeds the correction information back to first component mounting apparatus 30. With this, first component mounting apparatus 30 rewrites the operation parameters based on the correction information. First component mounting apparatus 30 is capable of identifying a part where a problem has occurred, before reaching the stage of manufacturing a defective substrate, and appropriately performing feedback control.

First component mounting apparatus 30 thus enhances the yields of the component mounting system.

Visual inspection controller 42 obtains, from print inspection apparatus 20, data indicating the result of an inspection on solder printed on a substrate. With this, even when solder is printed on a substrate at a position displaced from a specified position, for example, since first component mounting apparatus 30 deposits an electronic component at a position associated with the solder, visual inspection apparatus 40 does not determine the substrate on which this electronic component is deposited to be defective although the electronic component is deposited at the displaced position.

It should be noted that when an electronic component is visually defective, visual inspection controller 42 may transmit an operation prohibition command, via communicator 46, to solder printing apparatus 10, print inspection apparatus 20, first component mounting apparatus 30, visual inspection apparatus 40, second component mounting apparatus 50, reflow solder oven 60, and X-ray inspection apparatus 70. With this, component mounting line 1 stops its operation.

When it is determined that an elapsed time of an electronic component deposited on a substrate exceeds the expiration date of the electronic component, operation prohibition unit 43 prohibits the operation of visual inspection apparatus 40. Specifically, operation prohibition unit 43 outputs an operation prohibition command to visual inspection controller 42, and visual inspection controller 42 having received the command stops the operation of visual inspection operator 41. For example, when it is determined that the expiration date of an electronic component has expired, operation prohibition unit 43 prohibits, via visual inspection controller 42, the operation of visual inspection operator 41 that inspects an electronic component deposited on a substrate.

Notifier 44 notifies of information indicating a problem such that the expiration date of a member has expired or notifies that the expiration date of solder is approaching, based on the result of an electronic component inspection and the expiration date of the member. Based on the results of inspections each being performed by print inspection apparatus 20, visual inspection apparatus 40, or X-ray inspection apparatus 70, notifier 44 also notifies of information related to abnormality when an abnormality is detected in any of the inspection results or notifies of a sign predicting that a member becomes unusable when a sign of abnormality is detected in any of the inspection results. It should be noted that the configuration of notifier 44 is the same as that of notifier 14 in solder printing apparatus 10, the description of the same configuration is omitted.

Storage 45 stores operation parameters for inspecting an electronic component deposited on a substrate. Storage 45 also stores data indicating the result of an inspection on an electronic component deposited on a substrate, correction information created based on this data, etc.

Communicator 46 is a communication module that transmits, to quality control system 80, data indicating the result of an analysis on an electronic component deposited on a substrate, and receives an operation prohibition command, etc. from quality control system 80, etc.

[Second Component Mounting Apparatus]

Second component mounting apparatus 50 is an apparatus that deposits, on solder printed on a substrate, a package component sucked by a nozzle head. Second component mounting apparatus 50 is an example of one configuration included in apparatuses for component mounting.

Second component mounting apparatus 50 includes mounting operator 51, mounting controller 52, operation prohibition unit 53, notifier 54, storage 55, and communicator 56. Since the configuration of second component mounting apparatus 50 is the same as that of first component mounting apparatus 30, the description of mounting operator 51, mounting controller 52, notifier 54, storage 55, and communicator 56 in second component mounting apparatus 50 is omitted.

A package component according to this embodiment is an electronic component such as a ball grid array (BGA), a chip size package (CSP), etc., and is included in a component. Hereinafter, when "electronic component" is simply used in the description, the term connotes the meaning of package component. A substrate on which a package component is deposited is transported to reflow solder oven 60 via a conveyor. Second component mounting apparatus 50 transmits, to quality control system 80, data related to a package component deposited on a substrate.

Mounting controller 52 in second component mounting apparatus 50 feeds forward, to X-ray inspection apparatus 70, the data related to a package component deposited on a substrate.

According to this embodiment, this achieves an assembly product in which electronic components and package components are deposited on a solder printed substrate.

[Reflow Solder Oven]

Reflow solder oven 60 heats, in a reflow process, printed solder and a solder ball to melt them on a substrate, on which a component such as a package component is deposited and which is carried to reflow solder oven 60, and thereby joins the electronic component and the substrate by the solder.

Reflow solder oven 60 includes heating operator 61, heating controller 62, operation prohibition unit 63, notifier 64, storage 65, and communicator 66.

By heating a substrate on which an electronic component and a package component are deposited, heating operator 61 causes solder printed on the surface of the substrate to melt.

Heating controller 62 controls heating operator 61 based on operation parameters so that temperature is appropriately controlled for melting solder when an assembly product is heated. Heating controller 62 transmits data related to heating to quality control system 80 via communicator 66.

Upon obtaining an operation prohibition command, operation prohibition unit 63 prohibits an operation of reflow solder oven 60. Specifically, operation prohibition unit 63 outputs an operation prohibition command to heating controller 62, and heating controller 62 having received the command stops the drive of heating operator 61. For example, when it is determined that the expiration date of a member expires, operation prohibition unit 63 prohibits, via heating controller 62, the operation of heating operator 61 that heats an assembly product. When an operation prohibition command is obtained from other apparatus, operation prohibition unit 63 stops the drive of heating operator 61.

Notifier 64 notifies of information indicating a problem such that the expiration date of a member has expired, based on the expiration date of the member, etc. Based on the results of inspections each being performed by print inspection apparatus 20, visual inspection apparatus 40, or X-ray inspection apparatus 70, notifier 64 also notifies of information related to abnormality when an abnormality is detected in any of the inspection results or notifies of a sign predicting that a member becomes unusable when a sign of abnormality is detected in any of the inspection results. It should be noted that the configuration of notifier 64 is the same as that of notifier 14 included in solder printing apparatus 10, the description of the same configuration is omitted.

Storage 65 stores operation parameters for heating an assembly product, etc.

Communicator 66 is a communication module that transmits, to quality control system 80, data related to heating, and receives an operation prohibition command, etc. from quality control system 80, etc.

[X-Ray Inspection Apparatus]

X-ray inspection apparatus 70 inspects, using X-rays, defects in a solder joint between an electronic component and a substrate. X-ray inspection apparatus 70 obtains the result of an inspection in which a radiographic inspection is conducted to examine the state of a substrate on which solder and a component other than the solder are mounted. In the case of inspecting a package component, for example, since a solder joint is hidden by a substrate and a component, it is impossible to inspect the state of the solder joint by using visual inspection apparatus 40, etc. X-ray inspection apparatus 70 is an apparatus to complement such a weak point of a visual inspection. It should be noted that X-ray radiography images or computed tomography (CT) images may be used as X-ray images. Alternatively, an ultrasonic inspection apparatus that inspects defects in the state of a solder joint between an electronic component and a substrate may be used instead of X-ray inspection apparatus 70. X-ray inspection apparatus 70 is also referred to as "automatic X-ray inspection (AXI) apparatus". X-ray inspection apparatus 70 is one example of an inspection apparatus.

X-ray inspection apparatus 70 includes X-ray inspection operator 71, X-ray inspection controller 72, operation prohibition unit 73, notifier 74, storage 75, and communicator 76.

X-ray inspection operator 71 processes X-ray images obtained by irradiating, with X-rays, a product manufactured by joining electronic components and a substrate by solder, and inspects the state of a solder joint between the electronic components and the substrate.

X-ray inspection controller 72 causes X-ray inspection operator 71 to inspect a solder joint based on operation parameters, and thus analyzes electronic components joined to the substrate. Specifically, X-ray inspection controller 72 analyzes the amount of solder between an electronic component and a substrate or analyzes the presence/absence of defects such as void formation and dewetting.

X-ray inspection controller 72 feeds back, via communicator 76, data indicating the result of an inspection on the state of a solder joint that joins a substrate and a package component, to second component mounting apparatus 50, and feeds back, to solder printing apparatus 10, data indicating the result of the inspection on the state of the solder joint that joins the substrate and the package component as well as the result of an inspection on the state of a solder joint that joins the substrate and an electronic component. Specifically, when an abnormality is detected in the result of an X-ray inspection, X-ray inspection controller 72 creates correction information based on the detected abnormality and feeds back the correction information to second component mounting apparatus 50 in order to overcome the problem caused by operation parameters for second component mounting apparatus 50. When variation in the placement of electronic components is within a predetermined range based on the operation parameters for second component mounting apparatus 50, for example, X-ray inspection controller 72 creates correction information based on the operation parameters, and feeds back the correction information to second component mounting apparatus 50. With this, second component mounting apparatus 50 rewrites the operation parameters for second component mounting apparatus 50 based on the correction information. X-ray inspection controller 72 also transmits data indicating the result of the inspection on the states of these solder joints, to quality control system 80 via communicator 76.

X-ray inspection controller 72 obtains, from visual inspection apparatus 40, data indicating the result of an inspection on electronic components deposited on a substrate. With this, the electronic components deposited on solder printed on the substrate are drawn closer to the land side of the substrate through self-alignment during a reflow process, for example. Thus, the position of an electronic component after reflow changes, in some cases, compared to the position of the electronic component before the reflow, that is, the position indicated in the data obtained from visual inspection apparatus 40. Accordingly, even when the position of an electronic component after reflow is displaced away from the position of the electronic component before the reflow, X-ray inspection controller 72 does not determine this product to be defective if the amount of displacement is within a predetermined range.

It should be noted that when a product is defective, X-ray inspection controller 72 may transmit, via communicator 76, an operation prohibition command to solder printing apparatus 10, print inspection apparatus 20, first component mounting apparatus 30, visual inspection apparatus 40, second component mounting apparatus 50, reflow solder oven 60, and X-ray inspection apparatus 70. With this, component mounting line 1 stops its operation.

When it is determined that an elapsed time of a member exceeds the expiration date of the member, operation prohibition unit 73 prohibits the operation of X-ray inspection apparatus 70. Specifically, operation prohibition unit 73 outputs an operation prohibition command to X-ray inspection controller 72, and X-ray inspection controller 72 having received the command stops the operation of X-ray inspection operator 71. For example, when it is determined that the expiration date of a member has expired, operation prohibition unit 73 prohibits, via X-ray inspection controller 72, the operation of X-ray inspection operator 71 that inspects a product.

Notifier 74 notifies of information indicating a problem such that the expiration date of a member has expired or notifies that the expiration date of the member is approaching, based on the result of a product inspection and the expiration date of the member. Based on the results of inspections each being performed by print inspection apparatus 20, visual inspection apparatus 40, or X-ray inspection apparatus 70, notifier 74 also notifies of information related to abnormality when an abnormality is detected in any of the inspection results or notifies of a sign predicting that a member becomes unusable when a sign of abnormality is detected in any of the inspection results. It should be noted that the configuration of notifier 74 is the same as that of notifier 14 in solder printing apparatus 10, the description of the same configuration is omitted.

Storage 75 stores operation parameters for inspecting a product. Storage 75 also stores data indicating the result of an inspection on the state of a solder joint, correction information created based on this data, etc.

Communicator 76 is a communication module that transmits, to quality control system 80, data indicating the result of an inspection on the state of a solder joint, and receives an operation prohibition command, etc. from quality control system 80, etc.

[Quality Control System]

Component mounting line 1 further includes quality control system 80. Quality control system 80 includes information obtainer 81, time limit management unit 82, storage 87, time counter 83, usability determiner 84, prohibition time estimator 85, and communicator 86.

Information obtainer 81 reads bar codes assigned to a member and causes storage 87 to store component information indicated by the bar codes. In this embodiment, information obtainer 81 causes storage 87 to store the member information of each member on a reel-to-reel basis. It should be noted that information obtainer 81 may cause storage 87 to store, as component information, information that has been input by an operator using a keyboard or a touch panel.

Time limit management unit 82 identifies each of members used in a product and manages, for each member, an expiration date and an elapsed time period of a member after the member is exposed to the air. For example, by reading bar codes on a packaged member when the member is exposed to the air, time limit management unit 82 obtains, via information obtainer 81, expiration date information of the member, which is included in the component information indicated by the bar codes. It should be noted that time limit management unit 82 may cause time counter 83 to start, at this point in time, counting time during which a member is exposed to the air. The following method may be employed for counting time during which a member is exposed to the air. The counting may be started from a time when cream solder is deposited on a mask (trigger information for starting the counting of solder exposure time), or a time when cream solder is deposited on a substrate in the case of using a cartridge type or tape dispenser type printing apparatus. Alternatively, time may be counted from a time when a package component is mounted on a substrate. The counting may be stopped at a time when the substrate enters reflow solder oven 60.

The member information according to this embodiment includes substrate information, component information, solder information, and inspection result information.

Substrate information is information related to a substrate. The substrate information includes, for example, substrate expiration date information indicating that solder and a substrate can be appropriately joined after a time point at which the substrate is exposed to the air, and substrate exposure time period information indicating a time period during which the substrate has been exposed to the air.

Component information is information related to an electronic component. The component information includes, for example, type information indicating a type of an electronic component, component expiration date information indicating a time period from a time point at which the electronic component is exposed to the air until a reflow process (i.e., until the electronic component is mounted on a substrate), and component exposure time period information indicating a time period during which the electronic component has been exposed to the air.

Solder information is information related to solder and includes, for example, information related to a type of solder, expiration date information indicating a time period from a time point at which the solder is exposed to the air until a time when an electronic component and a substrate can be appropriately joined using the solder, and solder exposure time period information indicating a time period during which the solder has been exposed to the air.

Inspection result information includes: data indicating a result of an analysis, by print inspection apparatus 20, on solder printed on a substrate; data indicating a result of an analysis, by visual inspection apparatus 40, on an electronic component deposited on a substrate; and data indicating a result of an analysis on a product by X-ray inspection apparatus 70.

Storage 87 stores member information including substrate information, component information, solder information, and a correlation chart. Storage 87 also stores a plurality of correlation charts each being associated with a type of members.

Figure 4:
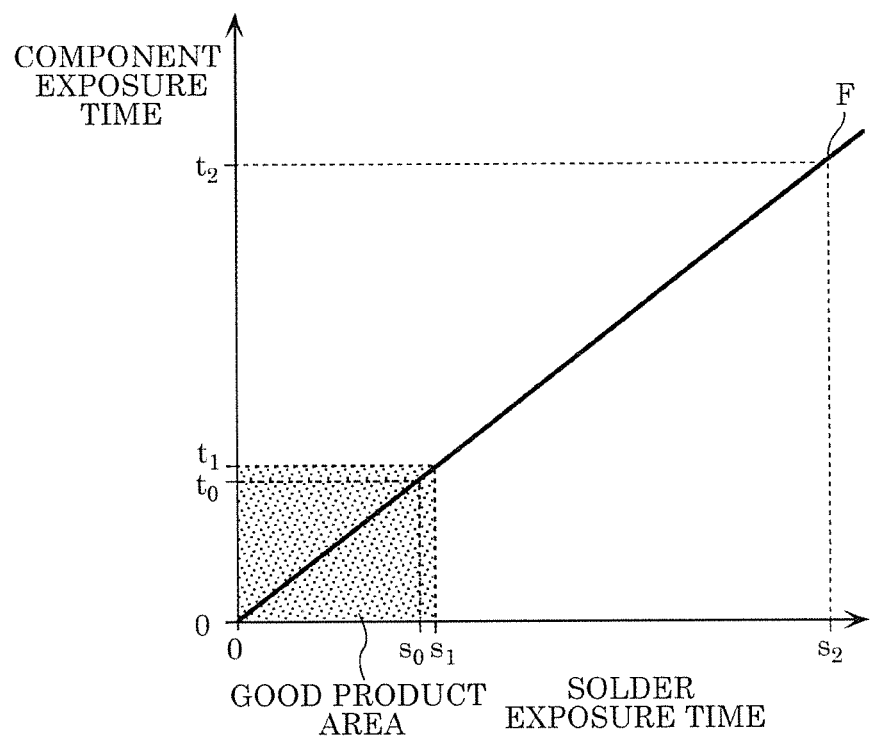
FIG. 4 illustrates a correlation chart according to Embodiment 1.

FIG. 4 illustrates correlation chart F according to Embodiment 1.

As illustrated in FIG. 4, correlation chart F is derived by time limit management unit 82 based on component information and solder information. Specifically, correlation chart F is derived based on a relationship between component expiration date information in component information and solder expiration date information in solder information.

In correlation chart F, a vertical axis presents solder exposure time and a horizontal axis presents component exposure time. The exposure time here indicates a time period during which a member is exposed to the air and indicates an elapsed time period of a member, which has already been mentioned above.

According to this correlation chart F, the solder exposure time increases as the component exposure time increases. When t2 denotes component expiration time in the component exposure time and s2 denotes solder expiration time corresponding to component exposure time t2, it is normally considered that a desired product can be achieved when an electronic component and a substrate are joined by solder in a time span enclosed by a line indicating t2 and a line indicating s2. The solder exposure time and the component exposure time, however, actually vary greatly depending on the temperature, humidity, etc. of the surrounding area where component mounting line 1 is located. In addition, a state in which a component or a substrate is exposed to the air (moisture included in a component) has influence on a state in which solder is exposed to the air. Accordingly, a good product is a product that has been manufactured in a good product area in dots and enclosed by a line indicating component exposure time t1 and a line indicating solder exposure time s1. It is conceivable that products manufactured in an area other than that become defective.

It should be noted that correlation chart F is derived based on the relationship between component expiration date information in component information and solder expiration date information in solder information, as illustrated in FIG. 4, but substrate expiration date information in substrate information may be additionally used to derive correlation chart F. In this case, X-axis may present solder exposure time, Y-axis may present component exposure time, and Z-axis may present substrate exposure time. The management of an elapsed time may be carried out by associating an elapsed time with at least any two of solder exposure time, component exposure time, and substrate exposure time. In other words, a plurality of correlation charts F each being associated with any combinations of a solder type, a substrate type, and a component type are created beforehand, and by selecting one correlation chart F from among correlation charts F depending on the type of solder, a substrate, or a component, and thus managing the elapsed times of the solder, substrate, and component, it is possible to manufacture a good product having a higher quality.

We now return to the description of component mounting line 1 illustrated in FIG. 2 and FIG. 3.

Time counter 83 counts, for each member, an elapsed time period which is a time period that has elapsed from a time when a member is exposed to the air until a present time (hereinafter referred to as "elapsed time period of a member" unless otherwise specified). For example, time counter 83 counts an elapsed time period from a time when an electronic component started being exposed to the air until a present time, an elapsed time period from a time when a substrate started being exposed to the air until a present time, and an elapsed time period from a time when solder started being exposed to the air until a present time. Time counter 83 outputs, to time limit management unit 82, elapsed time period information indicating these elapsed time periods of the members.

Usability determiner 84 determines the usability of a member based on the result of an inspection on the member, an elapsed time period of the member inspected, and the expiration date of the member. For example, usability determiner 84 determines, using correlation charts stored in storage 87, the usability of solder to be printed on a substrate by solder printing apparatus 10, usability of the solder printed on the substrate, the usability of electronic components mounted by first component mounting apparatus 30 and second component mounting apparatus 50, and the usability of a product manufactured by mounting the components on the substrate. The usability here means that the manufacture of a desired product can be expected by using a member, and means not only whether a member is usable but also whether a product can be manufactured within a good product area in a correlation chart. In view of the above, usability determiner 84 determines that a member is usable if the member is used within a time period indicated as a good product area in a correlation chart, and determines that a member is unusable if the member is not used within that time period.

Usability determiner 84 outputs information indicating a determination on the usability to solder printing apparatus 10, print inspection apparatus 20, first component mounting apparatus 30, visual inspection apparatus 40, second component mounting apparatus 50, reflow solder oven 60, and X-ray inspection apparatus 70.

Prohibition time estimator 85 estimates a use prohibition time from which the use of a member is prohibited, based on a correlation chart. Specifically, prohibition time estimator 85 estimates, based on the correlation chart, a time period from a time when a substrate is carried in by solder printing apparatus 10 until a time when a reflow process is completed. Prohibition time estimator 85 estimates a solder exposure time period based on solder expiration date information and a time period that has elapsed until a reflow process is completed, and estimates a component exposure time based on component expiration date information and the time period that has elapsed until the reflow process is completed. A use prohibition time is indicated in the solder exposure time period and the component exposure time period. Prohibition time estimator 85 then outputs information indicating a use prohibition time, to usability determiner 84.

Communicator 86 is a communication module that obtains substrate information from solder printing apparatus 10, first component mounting apparatus 30, second component mounting apparatus 50, print inspection apparatus 20, visual inspection apparatus 40, X-ray inspection apparatus 70, and reflow solder oven 60, and also obtains inspection information from print inspection apparatus 20, visual inspection apparatus 40, and X-ray inspection apparatus 70. Upon obtaining an operation prohibition command from any one of solder printing apparatus 10, print inspection apparatus 20, first component mounting apparatus 30, visual inspection apparatus 40, second component mounting apparatus 50, reflow solder oven 60, and X-ray inspection apparatus 70, communicator 86 transmits the operation prohibition command to other apparatuses, and stops the operation of component mounting line 1. It should be noted that substrate information also includes a time at which solder is printed on a substrate by solder printing apparatus 10, a time at which a component is mounted on the substrate by first component mounting apparatus 30, a time at which a component is mounted on the substrate by second component mounting apparatus 50, a time at which the substrate entered reflow solder oven 60, a time at which the substrate is carried in by each of solder printing apparatus 10, print inspection apparatus 20, first component mounting apparatus 30, visual inspection apparatus 40, second component mounting apparatus 50, reflow solder oven 60, and X-ray inspection apparatus 70, and a time at which the substrate is carried out from these apparatuses. Communicator 86 may passively receive such information from each of the apparatuses or quality control system 80 may transmit a request signal to each of the apparatuses and passively obtain information therefrom. Communicator 86 is one example of an inspection result obtainer.

[Operation]

Next, an operation of component mounting line 1 according to this embodiment will be described.

Figure 5:
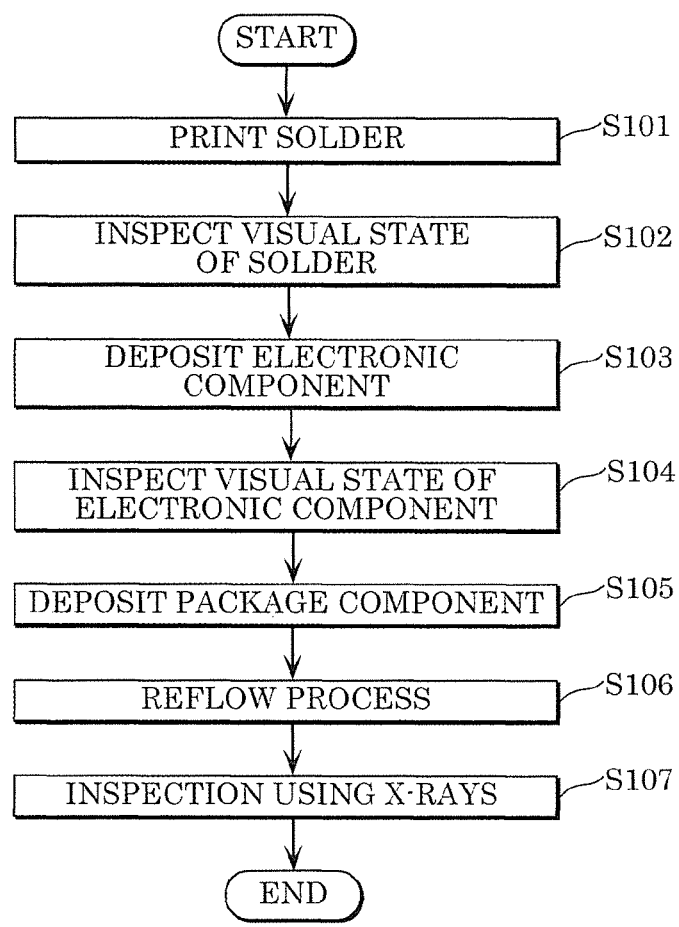
FIG. 5 illustrates an operation of the component mounting line according to Embodiment 1.

FIG. 5 illustrates an operation of component mounting line 1 according to Embodiment 1. Since a case where no abnormality is detected by print inspection apparatus 20, visual inspection apparatus 40, and X-ray inspection controller 72 is assumed in this flow, a process carried out in the case where a product is determined to be defective by print inspection apparatus 20, visual inspection apparatus 40, and X-ray inspection controller 72 is omitted.

As illustrated in FIG. 5, solder printing apparatus 10 prints solder on a substrate that has been carried into a mounting line (S101), and creates a substrate on which solder is printed. The substrate is carried to print inspection apparatus 20 by a conveyor.

Next, print inspection apparatus 20 inspects the visual state of the solder printed on the substrate (S102). Print inspection apparatus 20 feeds data indicating the result of the inspection on the visual state of the solder back to solder printing apparatus 10, and transmits the data to first component mounting apparatus 30, visual inspection apparatus 40, and quality control system 80. The substrate of which the visual state of the solder has been inspected is then carried to first component mounting apparatus 30 by the conveyor.

Next, first component mounting apparatus 30 deposits, on the solder printed on the substrate, an electronic component sucked by a nozzle head (S103). First component mounting apparatus 30 transmits data related to the electronic component deposited on the substrate to visual inspection apparatus 40 and quality control system 80. The substrate on which the electronic component has been mounted is then carried to visual inspection apparatus 40 by the conveyor.

Next, visual inspection apparatus 40 inspects the visual state of the electronic component deposited on the substrate (S104). Visual inspection apparatus 40 feeds data indicating the result of the inspection on the electronic component deposited on the substrate back to first component mounting apparatus 30, and also transmits the data to quality control system 80, second component mounting apparatus 50, and X-ray inspection apparatus 70. The substrate of which the visual state of the solder has been inspected is then carried to second component mounting apparatus 50 by the conveyor.

Next, second component mounting apparatus 50 deposits, on the solder printed on the substrate, a package component sucked by a nozzle head (S105). Second component mounting apparatus 50 transmits data related to the package component deposited on the substrate to X-ray inspection apparatus 70 and quality control system 80. The substrate on which these electronic components have been deposited is then carried to reflow solder oven 60 by the conveyor.

Next, reflow solder oven 60 heats, in a reflow process, the substrate on which these electronic components have been deposited, so that the solder melt (S106). With this, an assembly product in which the electronic components and the substrate are joined together by the solder is achieved. This assembly product is carried to X-ray inspection apparatus 70 by the conveyor.

Next, X-ray inspection apparatus 70 inspects, using X-rays, defects in a solder joint between each of the electronic components and the substrate (S107). X-ray inspection apparatus 70 feeds data related to the package component joined to the substrate, back to second component mounting apparatus 50, and transmits, to solder printing apparatus 10, data indicating the result of an analysis on the solder that joins the package component to the substrate and data related to the solder by which the electronic component and the substrate are joined together. In addition, X-ray inspection controller 72 transmits data indicating the analysis result to quality control system 80. In this way, with component mounting line 1, it is possible to obtain a product.

Next, the operation performed by quality control system 80 will be described.

Figure 6:
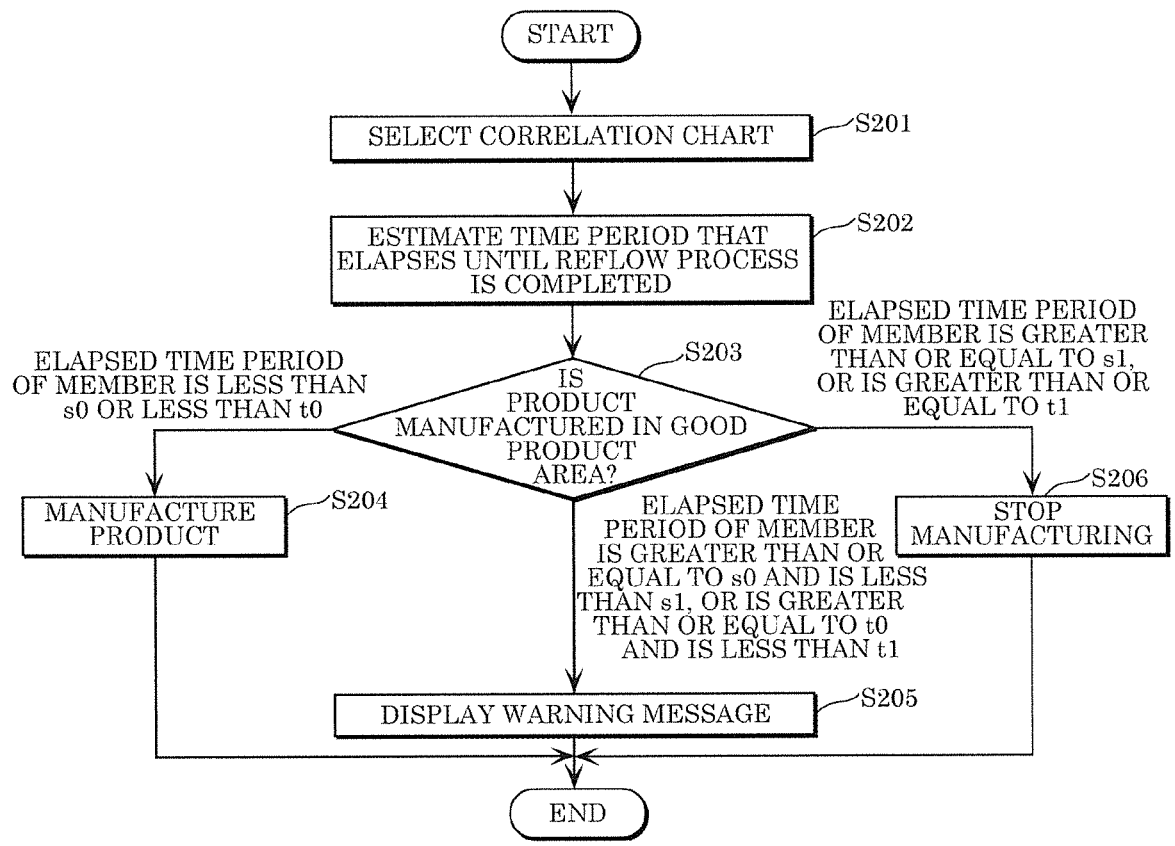
FIG. 6 illustrates an operation of determining whether a good product can be manufactured, based on the correlation chart according to Embodiment 1.

FIG. 6 is a flowchart illustrating an operation of determining whether a good product can be manufactured, based on the correlation chart according to Embodiment 1. In FIG. 6, it is assumed that information obtainer 81 obtains member information on each member and stores the member information in storage 87. It should be noted that the following processing is performed each time data is obtained from each of the apparatuses configuring component mounting line 1.

As illustrated in FIG. 6, time limit management unit 82 firstly selects a correlation chart appropriate for solder information and component information based on a relationship between solder expiration date information indicated in the solder information and component expiration date information indicated in the component information (S201). It should be noted that a correlation chart may be calculated by time limit management unit 82 for any combination of a type of component, a type of solder, and a substrate. Time limit management unit 82 may obtain a correlation chart from an external device.

Next, prohibition time estimator 85 estimates a time period from a time when a substrate is carried by solder printing apparatus 10 until a time when a reflow process is completed (S202). Specifically, prohibition time estimator 85 estimates a solder exposure time period based on solder expiration date information and a time period that has elapsed until a reflow process is completed, and estimates a component exposure time based on component expiration date information and the time period that has elapsed until the reflow process is completed.

Next, usability determiner 84 determines whether it is possible to manufacture a product within a time period indicated as a good product area (S203). Specifically, when the elapsed time of a member is greater than or equal to solder exposure time s1 or is greater than or equal to component exposure time t1 (an area other than the good product area) in FIG. 4, usability determiner 84 determines that it is impossible to manufacture a good product. When the elapsed time of a member is less than solder exposure time s1 and component exposure time t1, that is, within the good product area in FIG. 4, the usability determiner 84 determines that it is possible to manufacture a good product.

When usability determiner 84 determines that it is possible to manufacture a product within a good product area indicated in a correlation chart, that is, when the elapsed time period of a member is less than solder exposure time s0 or is less than component exposure time to, usability determiner 84 determines that a product is good and usable. Component mounting line 1 manufactures a product (S204). In this way, with component mounting line 1, it is possible to obtain a good product.

When usability determiner 84 determines that it is possible to manufacture a product within the good product area indicated in the correlation chart, that is, when the elapsed time period of a member is greater than or equal to solder exposure time s0 and is less than solder exposure time s1, or is greater than or equal to component exposure time t0 and is less than component exposure time t1, usability determiner 84 determines that there is a sign predicting that an unusable defective product occurs. Quality control system 80 causes solder printing apparatus 10, print inspection apparatus 20, first component mounting apparatus 30, visual inspection apparatus 40, second component mounting apparatus 50, and X-ray inspection apparatus 70 to display a warning message (S205).

When usability determiner 84 determines that it is impossible to manufacture a product within the good product area indicated in the correlation chart, that is, when the elapsed time period of a member is greater than or equal to solder exposure time s1, or is greater than or equal to component exposure time t1, usability determiner 84 determines that an unusable and defective product is manufactured. Quality control system 80 causes solder printing apparatus 10, print inspection apparatus 20, first component mounting apparatus 30, visual inspection apparatus 40, second component mounting apparatus 50, and X-ray inspection apparatus 70 to display a warning message and stop the operations of these apparatuses (S206). In this way, since this component mounting line produces a defective product, the manufacture of products is stopped.

Moreover, in component mounting line 1, a sign predicting the occurrence of a defective product is detected based on the probability of void formation in solder (also referred to as "void formation probability") and the degree of dewetting of solder. Here, the operation of quality control system 80 in the case of obtaining a result of an inspection conducted by X-ray inspection apparatus 70 will be described with reference to FIG. 7.

Figure 7A:
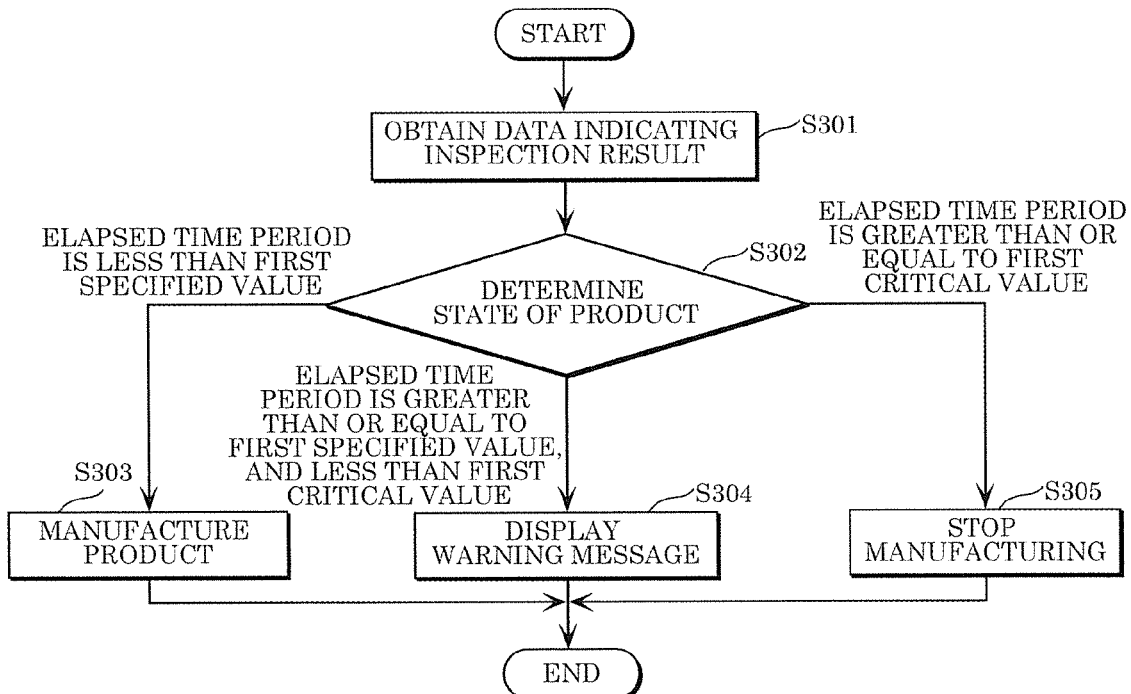
FIG. 7A illustrates an operation of determining the state of a product based on the probability of void formation, according to Embodiment 1.

FIG. 7A illustrates an operation of determining the state of a product based on the probability of void formation, according to Embodiment 1.

As illustrated in FIG. 7A, quality control system 80 obtains, from X-ray inspection apparatus 70, data indicating a result of an inspection in which the states of the electronic components joined to the substrate are analyzed (S301).

Next, based on the data indicating the analysis result obtained in Step S301, quality control system 80 determines the state of a product, that is, whether a product is good or defective, or whether a sign predicting that a product becomes defective is detected (S302). The sign predicting the occurrence of a defective product is detected based on the probability of void formation in the solder that has joined each of the electronic components and the substrate.

Specifically, usability determiner 84 determines whether a member is usable with respect to the presence/absence of void formation in solder, based on a correlation chart indicating a relationship between an elapsed time period, which is a time period that has elapsed until solder and a component other than the solder are mounted on a substrate, and the probability of void formation in the solder mounted on the substrate, which is calculated based on the inspection result obtained in Step S301. The elapsed time period during which the probability of void formation in the solder is less than or equal to a predetermined value, here, means an exposure time from a time when the solder is exposed to the air until a reflow process.

The formation of void in solder will be described with reference to FIG. 8C. FIG. 8C illustrates a state of a cross section, taken along the line VIIIA-VIIIA, of a good product according to Embodiment 1.

The probability of void formation in solder increases as the exposure time of the solder gets longer, as can be seen in correlation chart F in FIG. 4. In other words, the probability of void formation has a relationship correlated with correlation chart F in FIG. 4, and increases as the exposure time increases. Usability determiner 84 obtains, based on correlation chart F in FIG. 4, information indicating an elapsed time period associated with the probability of void formation in solder, that is, calculates the first critical value below which the probability of void formation is less than or equal to a predetermined value. When an elapsed time period managed by time limit management unit 82 is less than the first critical value, usability determiner 84 determines that a member is usable.

It should be noted that the probability of void formation in solder mounted on a substrate can be calculated using Equation (1).

$$\text{probability of void formation} = (Dv)^2/(Ds)^2 \qquad \text{Equation (1)}$$

Here, Dv denotes a diameter when solder is cut by a plane orthogonal to a direction in which an electronic component and a substrate face each other, whereas Ds denotes a diameter of a void.

As illustrated in FIG. 4, usability determiner 84 determines that there is a sign predicting that an unusable and defective product occurs when the elapsed time period is greater than or equal to the first specified value (s0 or t0) and is less than the first critical value (s1 or t1), determines that an unusable and defective product occurs when the elapsed time is greater than or equal to the first critical value (s1 or t1), and determines that a product is usable and good when the elapsed time is less than the first specified value (s0 or t0). "A product is usable" means that a product is a good product which satisfies certain criteria as a product whereas "a product is unusable" means that a product is a defective product which does not satisfy certain criteria as a product. The first critical value is one example of the first threshold value.

When the elapsed time period is greater than or equal to the first specified value and is less than the first critical value, usability determiner 84 determines that there is a sign predicting that an unusable and defective product occurs. Quality control system 80 causes solder printing apparatus 10, print inspection apparatus 20, first component mounting apparatus 30, visual inspection apparatus 40, second component mounting apparatus 50, and X-ray inspection apparatus 70 to display a warning message (S304).

When the elapsed time period is greater than or equal to the first critical value, usability determiner 84 determines that a product is unusable and defective. Quality control system 80 transmits an operation prohibition command to solder printing apparatus 10, print inspection apparatus 20, first component mounting apparatus 30, visual inspection apparatus 40, second component mounting apparatus 50, and X-ray inspection apparatus 70. An operation prohibition unit in each of the apparatuses stops the operation of a self-apparatus (S305).

When the elapsed time period is less than the first specified value, usability determiner 84 determines that a product is usable and good. Quality control system 80 causes solder printing apparatus 10, print inspection apparatus 20, first component mounting apparatus 30, visual inspection apparatus 40, second component mounting apparatus 50, and X-ray inspection apparatus 70 to continue the operation (S303).

Figure 7B:
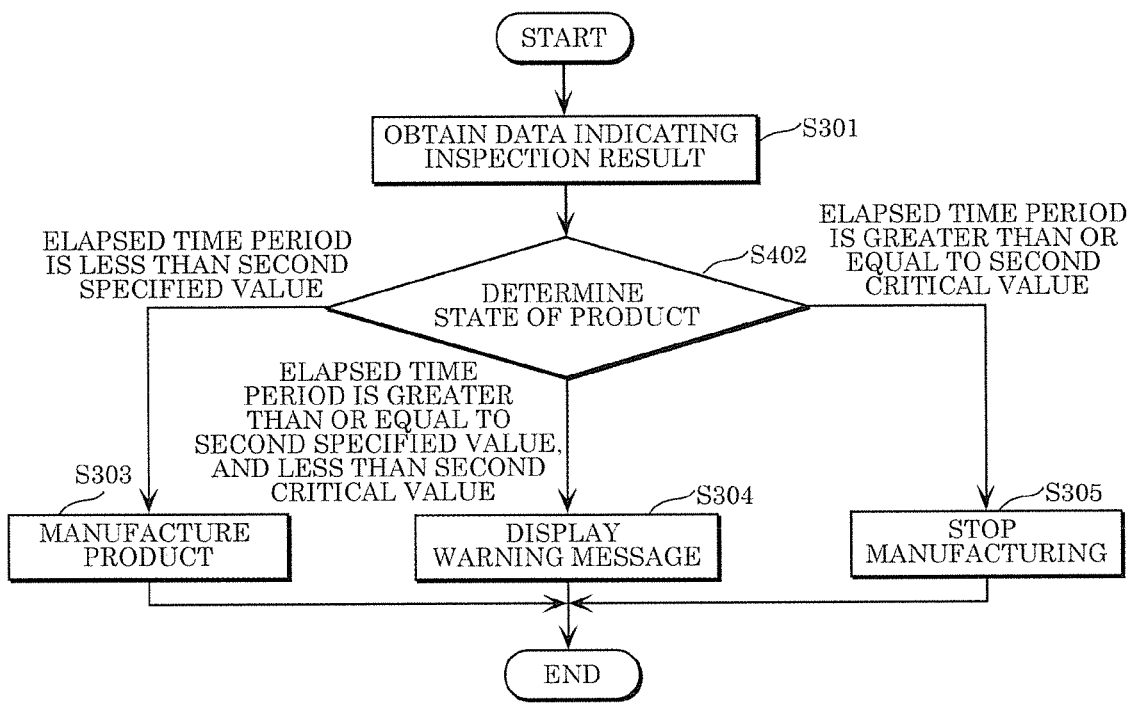
FIG. 7B illustrates an operation of determining the state of a product based on the degree of dewetting, according to Embodiment 1.

FIG. 7B illustrates an operation of determining the state of a product based on the degree of dewetting, according to Embodiment 1. In FIG. 7B, like reference signs are assigned to processing identical to that described in FIG. 7A and the description is omitted where appropriate.

As illustrated in FIG. 7B, processing in Step S301 is firstly performed.

Next, quality control system 80 determines, based on the data indicating the analysis result obtained in Step S301, the state of a product, that is, whether a product is good or defective, or whether there is a sign predicting that a product becomes defective (S402). The sign predicting the occurrence of a defective product is detected based on the degree of dewetting of the solder that has joined each of the electronic components and the substrate.

Specifically, usability determiner 84 determines whether a member is usable based on a correlation chart indicating a relationship between an elapsed time period, which is a time period that has elapsed until solder and a component other than the solder are mounted on a substrate, and the degree of dewetting of the member, which is calculated based on the inspection result obtained in Step S301. The degree of dewetting of solder here is represented by a distance from a surface of a substrate on which solder is printed to a surface of an electronic component, that is, the height of solder. The degree of dewetting of solder will be described with reference to FIG. 8A and FIG. 8B.

Figure 8A:
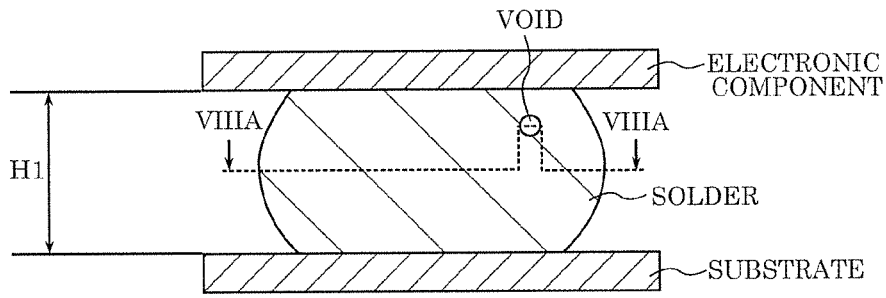
FIG. 8A illustrates a state of a cross section of a good product according to Embodiment 1.
Figure 8B:
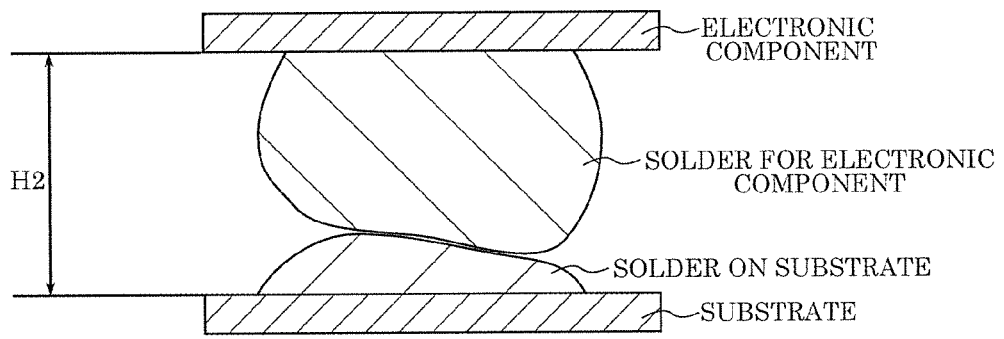
FIG. 8B illustrates a state of a cross section of a defective product according to Embodiment 1.
Figure 8C:
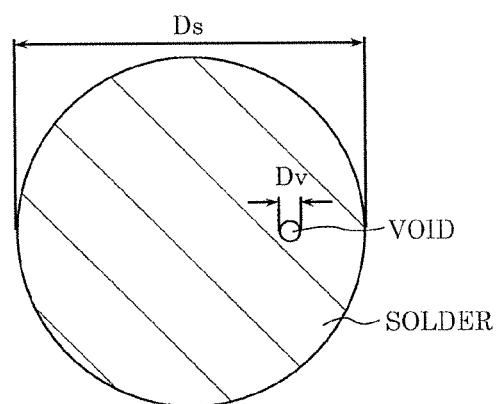
FIG. 8C illustrates a state of a cross section, taken along the line VIIIA-VIIIA, of the good product according to Embodiment 1.

FIG. 8A illustrates the state of a cross section of a good product according to Embodiment 1. In FIG. 8A, H1 denotes a height of solder between a substrate and an electronic component. FIG. 8B illustrates the state of a cross section of a defective product according to Embodiment 1. In FIG. 8B, H2 denotes a height of solder between a substrate and an electronic component, and is higher than height H1 in FIG. 8A. This is because it was impossible to adequately melt solder at the time of reflow when the wettability of the solder is insufficient, and this resulted in the state where solder printed on the substrate and solder deposited thereon for the electronic component are not appropriately joined.

To determine whether a member is usable, usability determiner 84 obtains, based on a correlation chart in FIG. 9, information indicating an elapsed time period associated with the degree of dewetting of the member, that is, calculates the second critical value for an elapsed time, below which the degree of dewetting is less than or equal to a predetermined value. When the elapsed time period of the member managed by time limit management unit 82 is less than the second critical value, usability determiner 84 determines that the member is usable.

Figure 9:
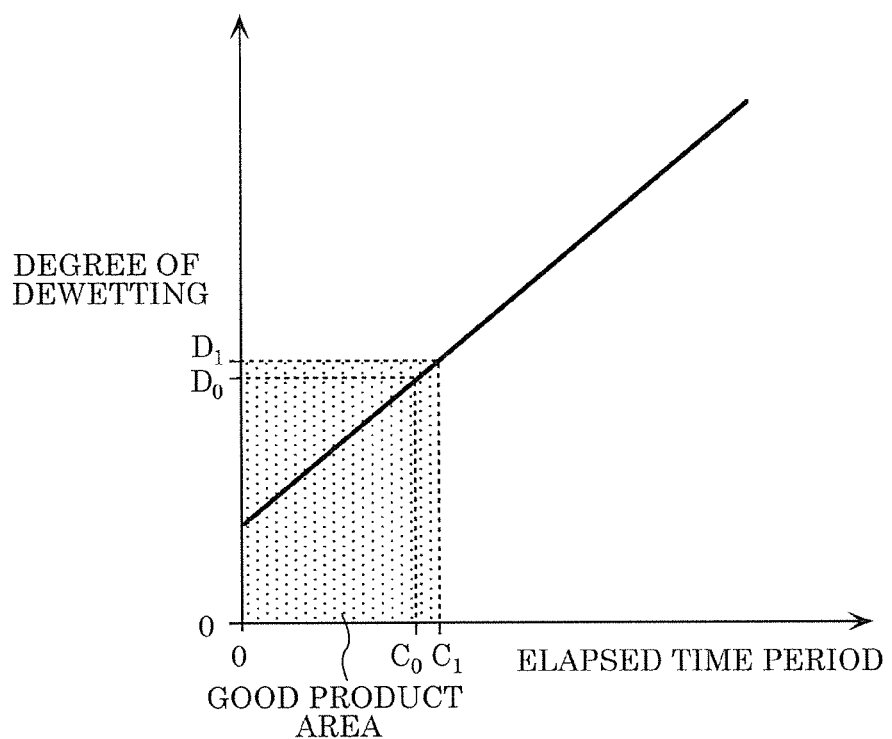
FIG. 9 illustrates an operation of determining whether a good product can be manufactured, based on the correlation chart according to Embodiment 1.

FIG. 9 illustrates an operation of determining whether a good product can be manufactured, based on the correlation chart according to Embodiment 1. In FIG. 9, when the degree of dewetting is less than D1, elapsed time period is less than C1. An area hatched by a line indicating the degree of dewetting D1 and a line indicating elapsed time period C1 is defined as a good product area.

When the elapsed time period is greater than or equal to the second specified value C0 and is less than the second critical value C1, usability determiner 84 determines that there is a sign predicting that an unusable and defective product occurs. When the elapsed time period is greater than or equal to the second critical value C1, usability determiner 84 determines that an unusable and defective product is manufactured, and when the elapsed time period is less than the second specified value C0, usability determiner 84 determines that a usable and good product is manufactured. It should be noted that the usability of a product is determined using at least one of the presence/absence of void formation in solder and the degree of dewetting of solder. The second critical value is one example of the second threshold value.

When the elapsed time is less than the second specified value, usability determiner 84 determines that a product is usable and good. Quality control system 80 causes solder printing apparatus 10, print inspection apparatus 20, first component mounting apparatus 30, visual inspection apparatus 40, second component mounting apparatus 50, and X-ray inspection apparatus 70 to continue the operation (S303).

When the elapsed time is greater than or equal to the second specified value and is less than the second critical value, as illustrated in FIG. 7B, usability determiner 84 determines that there is a sign predicting that an unusable and defective product occurs. Quality control system 80 causes solder printing apparatus 10, print inspection apparatus 20, first component mounting apparatus 30, visual inspection apparatus 40, second component mounting apparatus 50, and X-ray inspection apparatus 70 to display a warning message (S304).

When the elapsed time is greater than or equal to the second critical value, usability determiner 84 determines that a product is unusable and defective. Quality control system 80 transmits an operation prohibition command to solder printing apparatus 10, print inspection apparatus 20, first component mounting apparatus 30, visual inspection apparatus 40, second component mounting apparatus 50, and X-ray inspection apparatus 70. An operation prohibition unit in each of the apparatuses stops the operation of a self-apparatus (S305).

[Advantageous Effects]

Next, the advantageous effects of component mounting line 1, the component mounting method, and quality control system 80 according to this embodiment will be described.

As has been described above, in component mounting line 1 according to this embodiment, usability determiner 84 determines, for each member based on an elapsed time period of the member, whether the member is usable. The elapsed time period is a time period that has elapsed after the member is exposed to the air. The member comprises at least one of a substrate, solder, and a component other than the solder. With such component mounting line 1, if each of the members is usable, for example, it is possible to obtain a good product in which a substrate and a component are joined together by solder with a desired strength. When even just one of the members is determined to be usable, it is possible to detect a sign predicting that a defective product is obtained.

Accordingly, the detection of a sign predicting a failure in a solder joint between a substrate and a component can inhibit the manufacture of a defective product. Thus, with component mounting line 1, it is easier to manufacture good products.

It should be particularly noted that with component mounting line 1, it is possible to find out, before manufacturing a product, an expiration date of each member based on an elapsed time period of each member, and thereby determine, at a time point at which a component is joined to a substrate by solder, whether a good product or a defective product is going to be manufactured. Thus, it is possible to detect a sign predicting the start of the manufacture of a defective product resulting from a failed solder joint when a substrate and a component are joined by solder. As a result, with component mounting line 1, it is possible to inhibit the manufacture of defective products to manufacture good products. It is therefore possible to thus inhibit the reduction of yields in manufacturing products.

With component mounting line 1 according to this embodiment, if an elapsed time period until solder and a component other than the solder are mounted on a substrate gets longer, the expiration date of each member becomes shorter and the probability of void formation rises. Thus, by using a correlation chart, usability determiner 84 is capable of detecting a sign predicting the start of the manufacture of a defective product.

In component mounting line 1 according to this embodiment, since usability determiner 84 obtains, based on a correlation chart, the first threshold value for an elapsed time period, below which the probability of void formation in solder is less than or equal to a predetermined value, usability determiner 84 is capable of more accurately determining that a member is usable.

With component mounting line 1 according to this embodiment, if the elapsed time period of a member gets longer, the expiration date of the member becomes shorter because the member absorbs moisture in the air and the degree of dewetting increases. Thus, by using a correlation chart, usability determiner 84 is capable of detecting a sign predicting the start of the manufacture of a defective product.

With component mounting line 1 according to this embodiment, since usability determiner 84 obtains, based on a correlation chart, the second threshold value for an elapsed time period, below which the degree of dewetting of solder is less than or equal to a predetermined value, usability determiner 84 is capable of more accurately determining that a member is usable.

With component mounting line 1 according to this embodiment, the estimation of a use prohibition time based on a correlation chart, which is carried out by prohibition time estimator 85, enables usability determiner 84 to more accurately detect a sign predicting the start of the manufacture of a defective product. It is therefore possible to thus inhibit the manufacture of defective products.

With component mounting line 1 according to this embodiment, by using correlation charts each being associated with a type of members, it is possible to detect a sign predicting the start of the manufacture of a defective product that varies depending on a combination of the members. Thus, with such component mounting line 1, it is easier to manufacture good products.

With component mounting line 1 according to this embodiment, it is possible to print solder on a substrate by solder printing apparatus 10 and to conduct a radiographic inspection to examine the state of a member mounted.

With component mounting line 1 according to this embodiment, when a sign predicting that a member becomes unusable is detected in the result of a determination on whether the member is usable, it is notified that the sign has been detected. This enables, for example, solder printing apparatus 10 to stop printing solder on a substrate, first component mounting apparatus 30 and second component mounting apparatus 50 to stop mounting a component on the solder printed on the substrate, and X-ray inspection apparatus 70 to stop inspecting the state of a member.

Embodiment 2

[Configuration]

Figure 10:
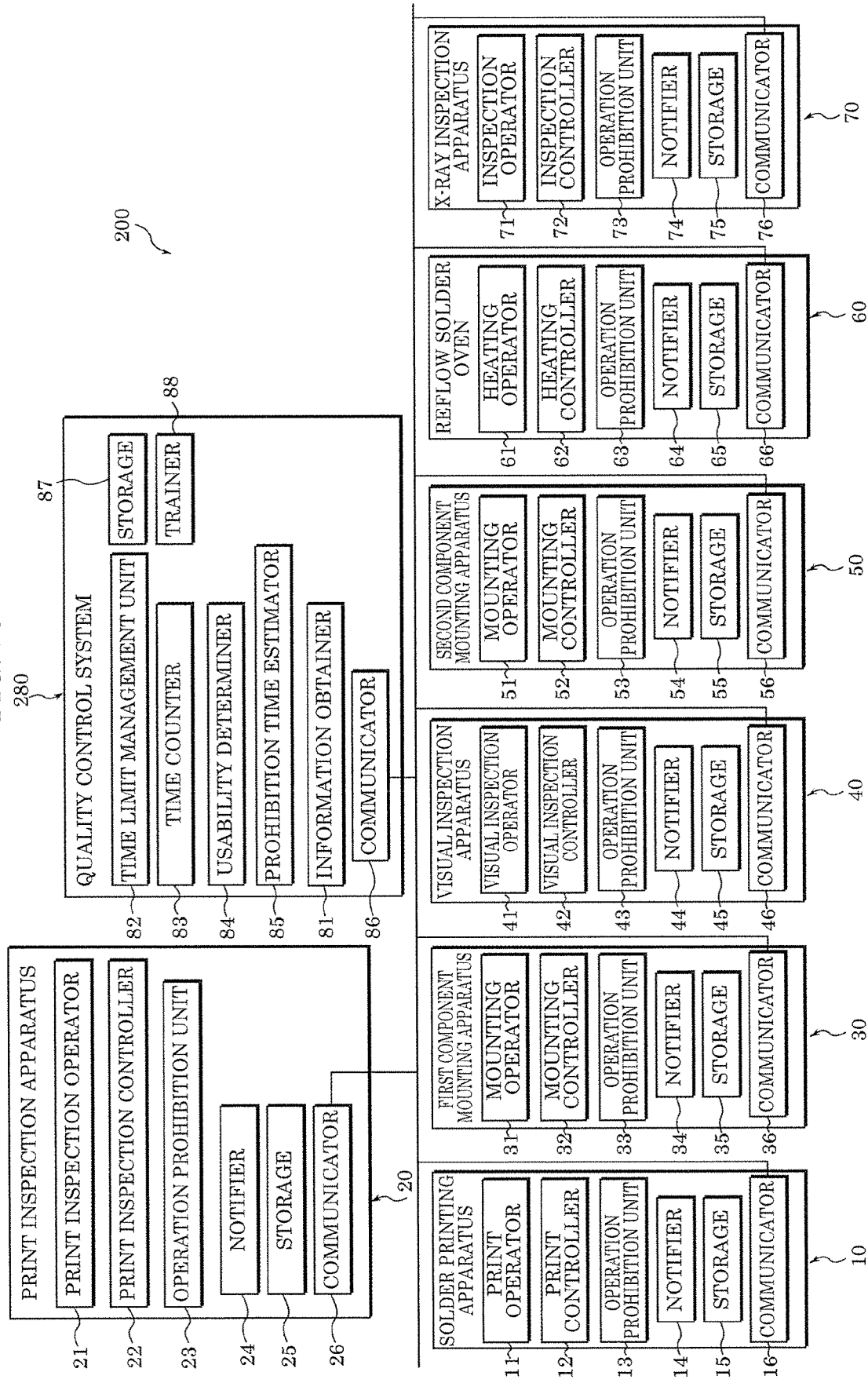
FIG. 10 is a block diagram illustrating a component mounting line according to Embodiment 2.

FIG. 10 is a block diagram illustrating component mounting line 200 according to Embodiment 2.

This embodiment differs from Embodiment 1 in that quality control system 280 further includes trainer 88 and uses feature information instead of a correlation chart.

The configuration of component mounting line 200, a component mounting method and quality control system 280 according to this embodiment are, unless otherwise clearly stated, the same as those described in Embodiment 1, therefore, like reference signs are assigned to same elements and the detailed description of the elements is omitted.

As illustrated in FIG. 10, quality control system 280 further includes trainer 88.

Trainer 88 performs training to enable the prediction of an optimal timing at which a defective product might be manufactured, based on member information that is stored in storage 87 and includes material information, component information, and solder information. To be more specific, publicly known machine learning such as learning with a teacher, learning without a teacher, reinforcement learning, etc. can be applied to the training.

For example, based on solder exposure time period information, component exposure time period information, substrate exposure time period information that are included in member information, the probability of void formation, the degree of dewetting, etc., trainer 88 evaluates a product manufactured using any combination of such information. The smaller a difference between a product manufactured and a standard product is, the higher the evaluation score of the manufactured product is. The evaluation score here is, for example, weighting. The evaluation scores may be set as follows: the shorter an exposure time period indicated by each of solder exposure time period information, component exposure time period information, and substrate exposure time period information is, the higher the evaluation score of each of the products manufactured is; the lower the probability of void formation in solder that has joined an electronic component and a substrate is, the higher the evaluation score of a product manufactured is; and the lower the degree of dewetting of solder that has joined an electronic component and a substrate is, the higher the evaluation score of a product manufactured is.

In this way, trainer 88 performs training by associating each of solder exposure time period information, component exposure time period information, substrate exposure time period information, the probability of void formation in solder, the degree of dewetting of solder, etc. with the corresponding evaluation score. Trainer 88 may determine, as optimal values, a product for which the highest scores are obtained in all the evaluations based on the following information: solder exposure time period information; component exposure time period information; substrate exposure time period information; the probability of void formation in solder; and the degree of dewetting of solder.

Trainer 88 thus generates, based on member information, feature information used as a model optimal for manufacturing good products. For example, trainer 88 generates, based on an elapsed time period of a member and the probability of void formation in solder, feature information indicating a tendency of the probability of void formation that varies each time the solder is mounted on a substrate, or generates, based on an elapsed time period of a member and the degree of dewetting of solder, feature information indicating a tendency of the degree of dewetting that varies each time the solder is mounted on a substrate.

Feature information is a neural network for determining whether a product is a good product, based on solder exposure time period information, component exposure time period information, substrate exposure time period information, the probability of void formation in solder, the degree of wetting of solder, etc. Trainer 88 performs training so that feature information which is a neural network is learned, by using, as teacher data, both data indicating a good product and data indicating a defective product, and updates feature information with the newly-learned feature information. When a product is manufactured, trainer 88 inputs component information, substrate information, and solder information to feature information, and determines whether the product is a good product based on an output value of the neural network.

[Operation]

Next, the operation performed by trainer 88 in quality control system 280 will be described.

Figure 11A:
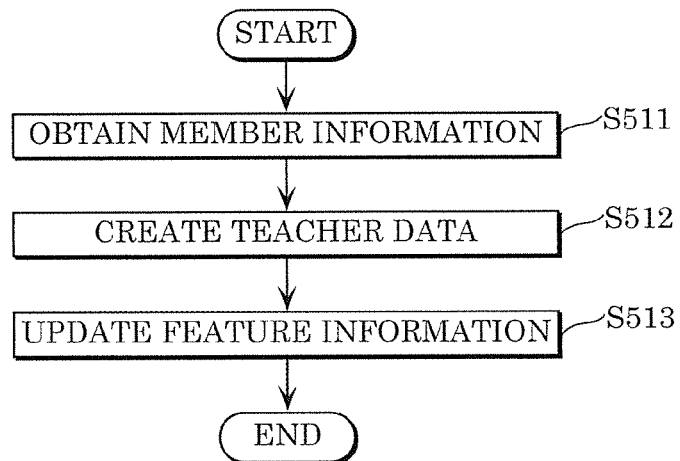
FIG. 11A is a diagram for explaining training using feature information performed by the component mounting line according to Embodiment 2.

FIG. 11A is a diagram for explaining training using feature information performed by component mounting line 200 according to Embodiment 2.

As illustrated in FIG. 11A, trainer 88 obtains member information from storage 87 (S511).

Next, trainer 88 creates, based on the member information, teacher data which has learned a model based on which a good product is manufactured and a model based on which a defective product is manufactured (S512).

Trainer 88 then inputs the created teacher data to feature information, and thus updates the feature information (S513). Then, quality control system 280 ends the processing.

Figure 11B:
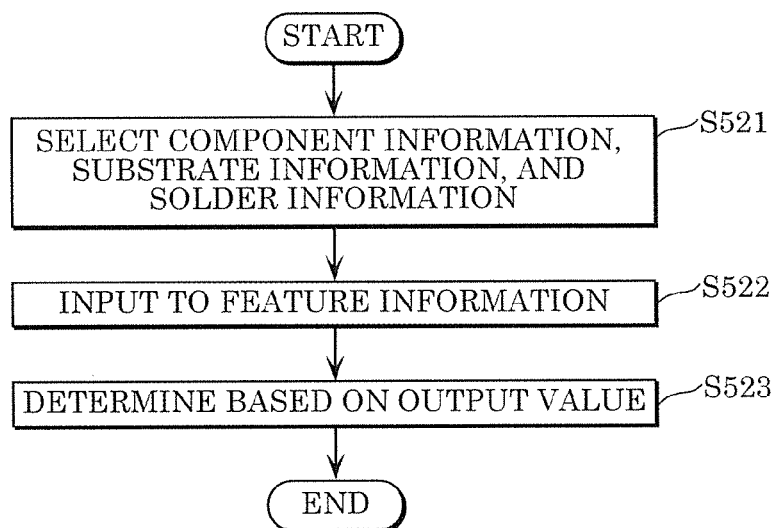
FIG. 11B is a diagram for explaining an operation using feature information performed by the component mounting line according to Embodiment 2.

FIG. 11B is a diagram for explaining an operation using feature information performed by component mounting line 200 according to Embodiment 2.

As illustrated in FIG. 11B, usability determiner 84 selects component information, substrate information, and solder information included in member information stored in memory 87, with which a product is to be manufactured.

Next, usability determiner 84 inputs the information selected in step S521 to feature information (S522).

Usability determiner 84 then determines whether a member is usable based on an output value that has been output based on the feature information (S523). Then, quality control system 280 ends the processing. With this, if a member is usable, quality control system 280 determines that a good product can be manufactured, and if the member is unusable, quality control system 280 determines to stop the process of manufacturing because a defective product is going to be manufactured.

[Advantageous Effects]

Next, the advantageous effects of component mounting line 200, the component mounting method, and quality control system 280 according to this embodiment will be described.

As has been described above, with component mounting line 200 according to this embodiment, trainer 88 is capable of performing training, through machine learning, using a tendency of the probability of void formation that is correlated with the elapsed time period of a member, and generating feature information indicating the result of the machine learning. Thus, prohibition time estimator 85 is capable of more precisely estimating a time point from which the use of a member is prohibited, based on the feature information indicating the tendency of the probability of void formation. As a result, with such component mounting line 200, it is easier to manufacture good products.

With component mounting line 200 according to this embodiment, trainer 88 is capable of performing training, through machine learning, using a tendency of the degree of dewetting that is correlated with the elapsed time period of a member, and generating feature information indicating the result of the machine learning. Thus, prohibition time estimator 85 is capable of more precisely estimating a time point from which the use of a member is prohibited, based on the feature information indicating the tendency of the degree of dewetting. As a result, with such component mounting line 200, it is easier to manufacture good products.

[Other Variations]

While the foregoing has described the present disclosure based on the exemplary embodiments, the present disclosure is not limited to the aforementioned component mounting line, component mounting method, and quality control system.

For example, in the component mounting line, component mounting method, and quality control system according to each of the exemplary embodiments, a visual inspection apparatus may be additionally placed after the second component mounting apparatus.

Each of the processing units included in the component mounting line, component mounting method, and quality control system according to each of the aforementioned Embodiments is typically realized, for example, as an LSI which is an integrated circuit. These circuits may be individually realized as one chip or may be realized as one chip including part or all of the circuits.

Each of the processing units to be realized as an integrated circuit is not limited to LSI and may be realized as a dedicated circuit or a general-purpose processor. A field programmable gate array (FPGA) which can be programmed after an LSI is manufactured or a reconfigurable processor which can reconfigure connection or setting of circuit cells inside an LSI may be used.

It should be noted that in each of the aforementioned embodiments, each component may be configured by dedicated hardware or may be realized by executing a software program suitable for each component. Each component may be realized by causing a program executing unit such as a CPU or a processor to read a software program recorded on a recording medium such as a hard disk or a semiconductor memory and execute the software program.

All the numbers used above are exemplary numbers to specifically describe the present disclosure, and the present disclosure is not limited to the illustrated numbers.

Division of a functional block in each block diagram is an example, and plural functional blocks may be realized as one functional block, one functional block may be divided into plural functional blocks, or part of functions may be transferred to another functional block. Besides, single hardware or software may process, in parallel or by way of time division, functions of plural functional blocks having similar functions.

An order to execute each step in the flowchart is an exemplary order for specifically describing the present dis-

What is claimed is:

1. A component mounting line comprising:
a plurality of component mounting apparatuses, each of which mounts a solder and a component other than the solder on a substrate; and
a quality control system comprising at least one processor having one or more integrated circuits configured to:
estimate an elapsed time period of a member, the elapsed time period being a time period that has elapsed after the member is exposed to air, the member comprising at least one of the substrate, the solder, and the component; and
determine whether the member can be manufactured within a component exposure time $t1$ and a solder exposure time $s1$ defining a good product area in a correlation chart indicating a relationship between the elapsed time period of the member and a probability of void formation in the solder mounted on the substrate, wherein:
when the elapsed time period of the member is greater than or equal to the solder exposure time $s1$ and when the elapsed time period of the member is greater than or equal to the component exposure time $t1$, the quality control system stops an operation of the component mounting apparatuses,
when the elapsed time period of the member is less than a solder exposure time $s0$ and when the elapsed time period of the member is less than a component exposure time $t0$, the quality control system continues the operation of the component mounting apparatuses, wherein the solder exposure time $s0$ is less than the solder exposure time $s1$, and the component exposure time $t0$ is less than the component exposure time $t1$, and
when the elapsed time period of the member is greater than or equal to the solder exposure time $s0$ and less than the solder exposure time $s1$ and when the elapsed time period of the member is greater than or equal to the component exposure time $t0$ and less than the component exposure time $t0$, the quality control system causes the plurality of component mounting apparatuses to display a warning message.

2. The component mounting line according to claim 1, further comprising:
an inspection controller that obtains an inspection result which is a result of a radiographic inspection conducted to examine a state of the substrate on which the solder and the component are mounted, wherein
the elapsed time period is a time period that has elapsed until the solder and the component are mounted on the substrate, the probability of void formation being calculated based on the inspection result.

3. The component mounting line according to claim 2, wherein
the at least one processor is further configured to obtain, based on the correlation chart, a first threshold value for the elapsed time period, below which the probability of void formation is less than or equal to a predetermined value, and determines that the member can be manufactured within the component exposure time $t1$ and the solder exposure time $s1$ when the elapsed time period is less than the first threshold value.

4. The component mounting line according to claim 1, further comprising:
an inspection controller that obtains an inspection result which is a result of a radiographic inspection conducted to examine a state of the substrate on which the solder and the component are mounted, wherein
the at least one processor is further configured to determine whether the member can be manufactured within the component exposure time $t1$ and the solder exposure time $s1$ based on a correlation chart indicating a relationship between the elapsed time period and a degree of dewetting of the member, the elapsed time period being a time period that has elapsed until the solder and the component are mounted on the substrate, the degree of dewetting being calculated based on the inspection result.

5. The component mounting line according to claim 4, wherein
the at least one processor is further configured to obtain, based on the correlation chart, a second threshold value for the elapsed time period, below which the degree of dewetting is less than or equal to a predetermined value, and determines that the member can be manufactured within the component exposure time $t1$ and the solder exposure time $s1$ when the elapsed time period is less than the second threshold value.

6. The component mounting line according to claim 2, wherein the at least one processor is further configured to estimate, based on the correlation chart, a use prohibition time which is a time from which a use of the member is prohibited, and output information indicating the use prohibition time, and wherein
the at least one processor is further configured to determines whether the member can be manufactured within the component exposure time $t1$ and the solder exposure time $s1$ based on the information indicating the use prohibition time.

7. The component mounting line according to claim 2, further comprising:
a storage that stores a plurality of correlation charts each being associated with a type of the member, the plurality of correlation charts each being the correlation chart.

8. The component mounting line according to claim 1, further comprising:
an inspection controller that obtains an inspection result which is a result of a radiographic inspection conducted to examine a state of the substrate on which the solder and the component are mounted, wherein the at least one processor is further configured to
generate feature information based on the elapsed time period and a probability of void formation in the solder mounted on the substrate, the feature information indicating a tendency of the probability of void formation that varies each time the solder is mounted on the substrate, the elapsed time period being a time period that has elapsed until the solder and the component are mounted on the substrate, the probability of void formation being calculated based on the inspection result, wherein the at least one processor is further configured to estimate, based on the feature information, a time from which a use of the member is prohibited.

9. The component mounting line according to claim 1, further comprising:

an inspection controller that obtains an inspection result which is a result of a radiographic inspection conducted to examine a state of the substrate on which the solder and the component are mounted, wherein the at least one processor is further configured to generate feature information based on the elapsed time period and a degree of dewetting of the member, the feature information indicating a tendency of the degree of dewetting that varies each time the solder is mounted on the substrate, the degree of dewetting being calculated based on the inspection result, wherein the at least one processor is further configured to estimate, based on the feature information, a time from which a use of the member is prohibited.

10. The component mounting line according to claim 1, further comprising:

a solder printing apparatus that prints solder on the substrate; and an inspection apparatus that conducts a radiographic inspection to examine a state of the member mounted.

11. The component mounting line according to claim 2, further comprising:

a notifier that notifies that, when a sign predicting that the member cannot be manufactured within the component exposure time t1 and the solder exposure time s1 is detected in the inspection result, the sign has been detected.

* * * * *